US009202821B2

(12) United States Patent
Brinkley et al.

(10) Patent No.: US 9,202,821 B2
(45) Date of Patent: Dec. 1, 2015

(54) THIN-FILM TRANSISTORS INCORPORATED INTO THREE DIMENSIONAL MEMS STRUCTURES

(71) Applicant: Pixtronix, Inc., San Diego, CA (US)

(72) Inventors: Patrick F. Brinkley, San Mateo, CA (US); Wilhelmus A. De Groot, Palo Alto, CA (US); Jasper L. Steyn, Cupertino, CA (US); Elif Selin Mungan, Lafayette, IN (US)

(73) Assignee: Pixtronix, Inc., San Diego, CA (US)

( * ) Notice: Subject to any disclaimer, the term of this patent is extended or adjusted under 35 U.S.C. 154(b) by 31 days.

(21) Appl. No.: 14/061,415

(22) Filed: Oct. 23, 2013

(65) Prior Publication Data

US 2015/0108479 A1    Apr. 23, 2015

(51) Int. Cl.
| | |
|---|---|
| *H01L 27/12* | (2006.01) |
| *H01L 29/66* | (2006.01) |
| *H01L 29/786* | (2006.01) |
| *B81C 1/00* | (2006.01) |
| *G02B 26/02* | (2006.01) |

(52) U.S. Cl.
CPC ........ *H01L 27/1218* (2013.01); *B81C 1/00246* (2013.01); *G02B 26/023* (2013.01); *H01L 27/1255* (2013.01); *H01L 29/6675* (2013.01); *H01L 29/78603* (2013.01); *H01L 29/78642* (2013.01); *B81B 2207/015* (2013.01); *B81C 2203/0742* (2013.01); *B81C 2203/0778* (2013.01)

(58) Field of Classification Search
CPC ............... H01L 27/1218; H01L 29/78642; B81B 2207/015; B81C 2203/0778
USPC ............ 257/59, 66, 653, E29.024, E29.025; 438/673; 348/296
See application file for complete search history.

(56) References Cited

U.S. PATENT DOCUMENTS

| | | |
|---|---|---|
| 5,229,310 A | 7/1993 | Sivan |
| 5,235,189 A | 8/1993 | Hayden et al. |
| 5,574,294 A * | 11/1996 | Shepard .......................... 257/66 |
| 5,621,222 A | 4/1997 | Kimura |
| 6,426,251 B2 | 7/2002 | Bronner et al. |

(Continued)

FOREIGN PATENT DOCUMENTS

WO     2006091738 A1     8/2006

OTHER PUBLICATIONS

International Search Report and Written Opinion—PCT/US2014/060110—ISA/EPO—Jan. 5, 2015.

*Primary Examiner* — Earl Taylor
(74) *Attorney, Agent, or Firm* — Edward A. Gordon; Foley & Lardner LLP

(57) ABSTRACT

This disclosure provides systems, methods and apparatus for forming electromechanical systems (EMS) displays where the area of a substrate occupied by a pixel circuit can be reduced if portions of the pixel circuit can be built in three dimensions. In some aspects, certain EMS displays can incorporate structures that are substantially normal to the surface of a substrate. Incorporating circuit components, such as transistors, into such structures, can reduce the area they occupy within the plane of the substrate. In some aspects, the components of a transistor can be fabricated directly into a MEMS anchor that supports a light modulator or a portion of an actuator over the substrate. In some other aspects, the transistor can be fabricated on one or more sidewalls of any MEMS structure.

28 Claims, 15 Drawing Sheets

(56) References Cited

U.S. PATENT DOCUMENTS

| | | |
|---|---|---|
| 6,872,658 B2 * | 3/2005 | Arakawa et al. .............. 438/673 |
| 7,405,852 B2 * | 7/2008 | Brosnihan et al. ......... 359/198.1 |
| 7,839,356 B2 | 11/2010 | Hagood et al. |
| 8,791,474 B1 * | 7/2014 | Bibl et al. ...................... 257/89 |
| 2006/0246637 A1 * | 11/2006 | Voutsas et al. ................ 438/149 |
| 2007/0002156 A1 * | 1/2007 | Hagood et al. ................ 348/296 |
| 2007/0075365 A1 | 4/2007 | Mardilovich et al. |
| 2012/0295058 A1 | 11/2012 | Brosnihan et al. |

* cited by examiner

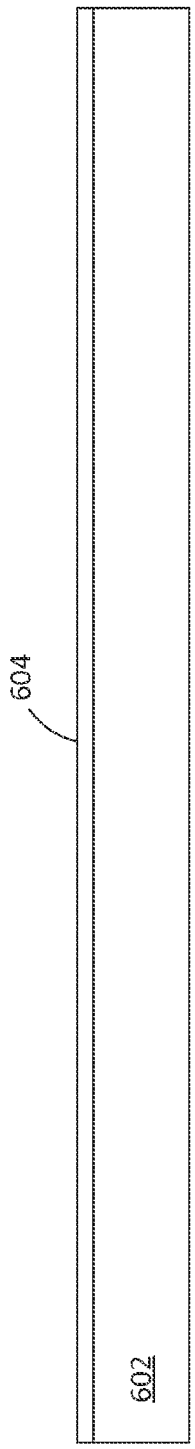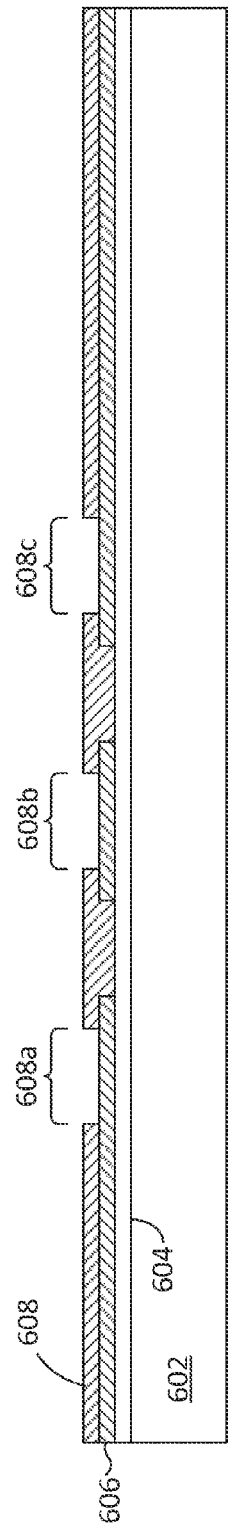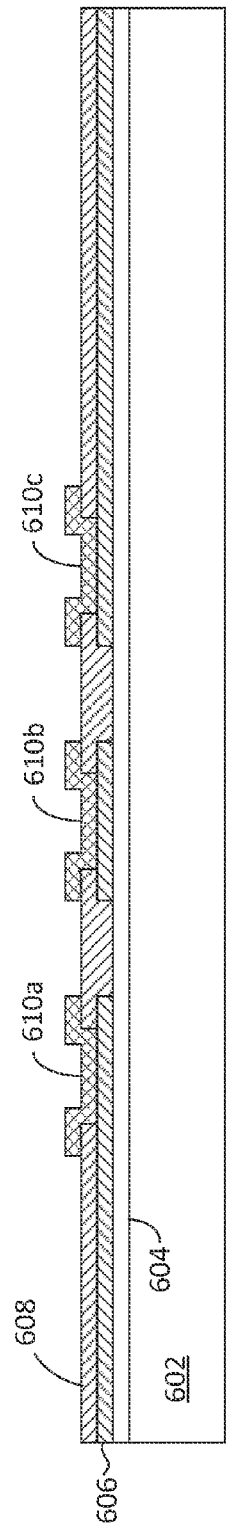

THIN-FILM TRANSISTORS INCORPORATED INTO THREE DIMENSIONAL MEMS STRUCTURES

TECHNICAL FIELD

This disclosure relates to the field of imaging displays, and in particular to pixel circuits for display elements.

DESCRIPTION OF THE RELATED TECHNOLOGY

Electromechanical systems (EMS) devices include devices having electrical and mechanical elements, such as actuators, optical components (such as mirrors, shutters, and/or optical film layers) and electronics. EMS devices can be manufactured at a variety of scales including, but not limited to, microscales and nanoscales. For example, microelectromechanical systems (MEMS) devices can include structures having sizes ranging from about a micron to hundreds of microns or more. Nanoelectromechanical systems (NEMS) devices can include structures having sizes smaller than a micron including, for example, sizes smaller than several hundred nanometers. Electromechanical elements may be created using deposition, etching, lithography, and/or other micromachining processes that etch away parts of deposited material layers, or that add layers to form electrical and electromechanical devices.

EMS-based display apparatus have been proposed that include display elements that modulate light by selectively moving a light blocking component into and out of an optical path through an aperture defined through a light blocking layer. Doing so selectively passes light from a backlight or reflects light from the ambient or a front light to form an image.

SUMMARY

The systems, methods and devices of the disclosure each have several innovative aspects, no single one of which is solely responsible for the desirable attributes disclosed herein.

One innovative aspect of the subject matter described in this disclosure can be implemented in an apparatus including a substrate, an electromechanical systems (EMS) structure having a first sidewall extending up from the substrate, where the first sidewall is formed from a plurality of layers of material, and a thin-film transistor having a component that forms a portion of at least a first layer of the first sidewall. In some implementations, a ratio of a height of the first sidewall over a thickness of the first sidewall is at least about 4:1.

In some implementations, the first layer of the first sidewall forms a channel of the thin-film transistor, and the first layer includes an amorphous semiconductor. In some implementations, at least a second layer of the first sidewall forms a gate terminal of the thin-film transistor. In some implementations, the first layer of the first sidewall forms a source terminal or a drain terminal of the thin-film transistor.

In some implementations, the EMS structure includes a floor, and at least one layer of material of the floor of the EMS structure forms a gate terminal of the thin-film transistor. In some such implementations, the EMS structure includes an elevated surface that is elevated with respect to the floor, and at least one layer of material of the elevated surface forms a source or a drain terminal of the thin-film transistor.

In some other implementations, the EMS structure includes a floor, and at least one layer of material of the floor of the EMS structure forms a source or drain terminal of the thin-film transistor. In some implementations, the EMS structure includes an elevated surface that is elevated with respect to the floor, and at least one layer of material of the elevated surface forms a gate terminal of the thin-film transistor. In some implementations, the apparatus further includes an EMS light modulator suspended over the substrate, where the EMS structure includes an anchor that supports a portion of an actuator configured to control the state of the EMS light modulator, and the transistor controls the application of an actuation voltage to the portion of the actuator. In some implementations, the first sidewall is oriented at least substantially normal to the substrate.

In some implementations, the apparatus further includes a display having the substrate, the EMS structure and the thin film transistor, a processor that is configured to communicate with the display, the processor being configured to process image data, and a memory device that is configured to communicate with the processor. In some implementations, the apparatus further includes a driver circuit configured to send at least one signal to the display, and a controller configured to send at least a portion of the image data to the driver circuit. In some implementations, the apparatus further includes an image source module configured to send the image data to the processor, where the image source module includes at least one of a receiver, transceiver, and transmitter. In some implementations, the apparatus further includes an input device configured to receive input data and to communicate the input data to the processor.

Another innovative aspect of the subject matter described in this disclosure can be implemented in a method for fabricating a thin-film transistor. In some implementations, the method includes depositing a sacrificial mold over a substrate, patterning the sacrificial mold to form at least one surface that forms an angle with the substrate, depositing a first conductor over the sacrificial mold such that the first conductor coats the surface of the sacrificial mold that is substantially normal to the substrate, patterning the first conductor to form at least one of a source, a drain, and a gate terminal of the thin-film transistor, depositing a semiconductor material over the patterned sacrificial mold, and patterning the deposited semiconductor material to form a channel of the thin-film transistor, such that a ratio of a height of the thin-film transistor from the substrate to a thickness of the thin-film transistor is at least about 4:1.

In some implementations, patterning the sacrificial mold to form at least one surface that forms an angle with the substrate includes patterning the sacrificial mold to form the at least one surface substantially normal to the substrate. In some implementations, depositing the semiconductor material over the patterned sacrificial mold includes depositing an amorphous semiconductor material. In some implementations, the method further includes depositing an anchor material over the surface of the sacrificial mold that is substantially normal to the substrate, such that depositing the first conductor over the sacrificial mold includes depositing the first conductor over the anchor material.

In some implementations, the method further includes patterning the sacrificial mold to form at least one surface that is substantially parallel to the substrate, depositing a second conductor over the sacrificial mold such that the second conductor coats the surface of the sacrificial mold that is substantially parallel to the substrate, and patterning the second conductor to form the other of the source, drain, and gate terminal of the thin-film transistor. In some such implementations, patterning the sacrificial mold to form at least one surface that is substantially parallel to the substrate includes patterning the sacrificial mold to form the at least one surface that is substantially parallel to and elevated from the substrate. In some such implementations, the method further includes depositing a second conductor over the sacrificial mold such that the second conductor coats the surface of the sacrificial mold that is substantially parallel to and elevated from the substrate, and patterning the second conductor to form the other of the source, drain, and gate terminal of the thin-film transistor.

Details of one or more implementations of the subject matter described in this specification are set forth in the accompanying drawings and the description below. Although the examples provided in this summary are primarily described in terms of electromechanical systems (EMS) based displays, the concepts provided herein may apply to other types of displays, such as liquid crystal displays (LCDs), organic light-emitting diode (OLED) displays, electrophoretic displays, and field emission displays, as well as to other non-display EMS devices, such as EMS microphones, sensors, and optical switches. Other features, aspects, and advantages will become apparent from the description, the drawings, and the claims. Note that the relative dimensions of the following figures may not be drawn to scale.

BRIEF DESCRIPTION OF THE DRAWINGS

FIGS. 6A-6J show example cross-sectional views of the results of various manufacturing stages of an example process to form an anchor incorporating a TFT into its structure.

Like reference numbers and designations in the various drawings indicate like elements.

DETAILED DESCRIPTION

Figure 1A:
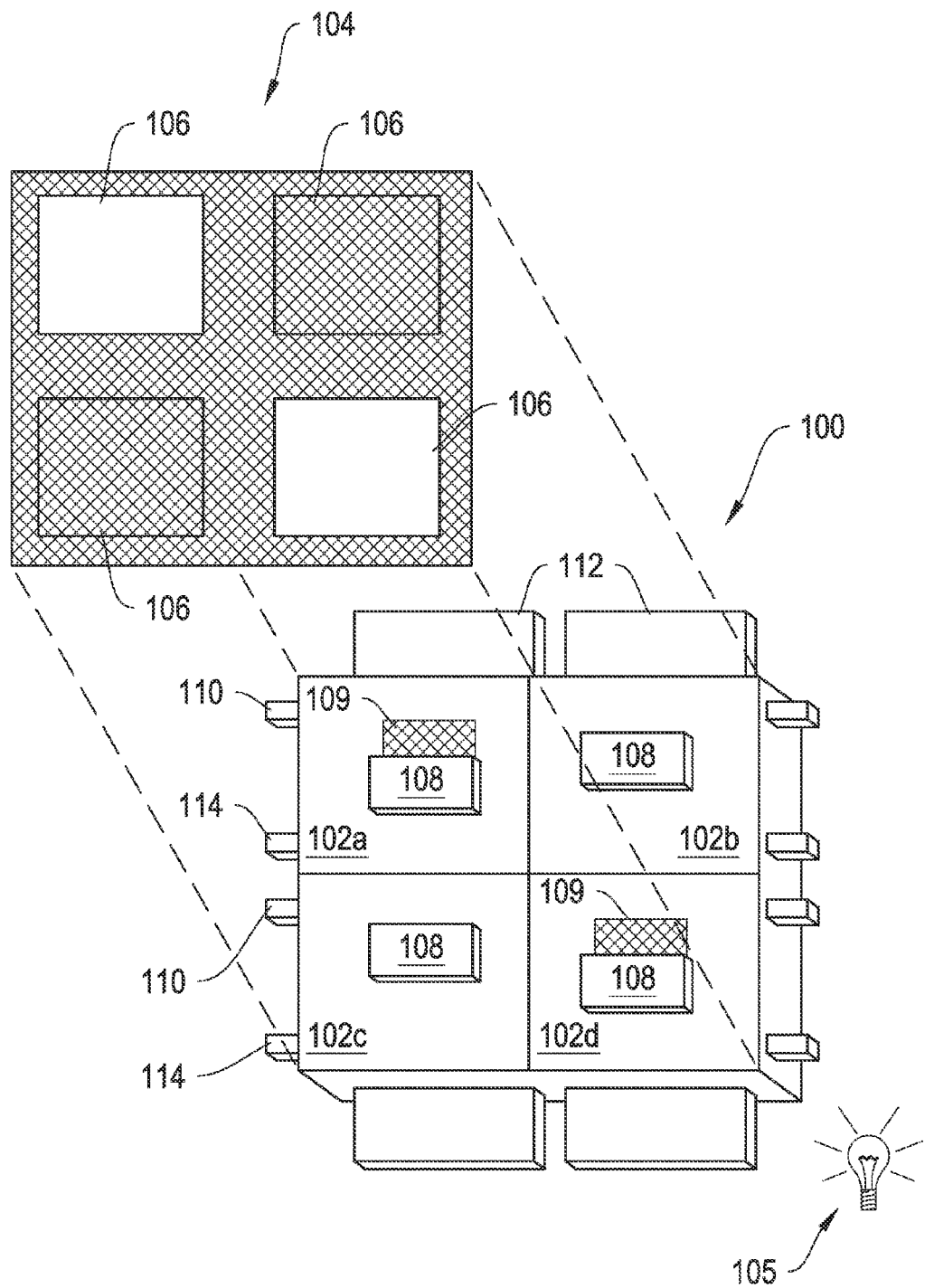
FIG. 1A shows a schematic diagram of an example direct-view microelectromechanical systems (MEMS) based display apparatus.

The following description is directed to certain implementations for the purposes of describing the innovative aspects of this disclosure. However, a person having ordinary skill in the art will readily recognize that the teachings herein can be applied in a multitude of different ways. The described implementations may be implemented in any device, apparatus, or system that can be configured to display an image, whether in motion (such as video) or stationary (such as still images), and whether textual, graphical or pictorial. More particularly, it is contemplated that the described implementations may be included in or associated with a variety of electronic devices such as, but not limited to: mobile telephones, multimedia Internet enabled cellular telephones, mobile television receivers, wireless devices, smartphones, Bluetooth® devices, personal data assistants (PDAs), wireless electronic mail receivers, hand-held or portable computers, netbooks, notebooks, smartbooks, tablets, printers, copiers, scanners, facsimile devices, global positioning system (GPS) receivers/navigators, cameras, digital media players (such as MP3 players), camcorders, game consoles, wrist watches, clocks, calculators, television monitors, flat panel displays, electronic reading devices (for example, e-readers), computer monitors, auto displays (including odometer and speedometer displays, etc.), cockpit controls and/or displays, camera view displays (such as the display of a rear view camera in a vehicle), electronic photographs, electronic billboards or signs, projectors, architectural structures, microwaves, refrigerators, stereo systems, cassette recorders or players, DVD players, CD players, VCRs, radios, portable memory chips, washers, dryers, washer/dryers, parking meters, packaging (such as in electromechanical systems (EMS) applications including microelectromechanical systems (MEMS) applications, as well as non-EMS applications), aesthetic structures (such as display of images on a piece of jewelry or clothing) and a variety of EMS devices. The teachings herein also can be used in non-display applications such as, but not limited to, electronic switching devices, radio frequency filters, sensors, accelerometers, gyroscopes, motion-sensing devices, magnetometers, inertial components for consumer electronics, parts of consumer electronics products, varactors, liquid crystal devices, electrophoretic devices, drive schemes, manufacturing processes and electronic test equipment. Thus, the teachings are not intended to be limited to the implementations depicted solely in the Figures, but instead have wide applicability as will be readily apparent to one having ordinary skill in the art.

In some implementations of an EMS display, each pixel is controlled by a pixel circuit formed on a substrate. The area of the substrate occupied by the pixel circuit can be reduced if portions of the pixel circuit can be built in three dimensions. For example, certain EMS displays incorporate structures that are substantially normal to the surface of a substrate. Incorporating circuit components, such as transistors, into such structures, can reduce the area the circuit components occupy within the plane of the substrate. In some implementations, the components of a thin-film-transistor (TFT) can be fabricated directly into a MEMS anchor that supports a light modulator or a portion of an actuator over the substrate. In some other implementations, the transistor can be fabricated into one or more sidewalls of any MEMS structure.

Particular implementations of the subject matter described in this disclosure can be implemented to realize one or more of the following potential advantages. Fabricating TFTs on or as part of three-dimensional structures formed on a substrate of an EMS display can reduce the area occupied by the TFTs within the plane of the substrate. This reduces the area on the substrate needed to fabricate a pixel. Thus, pixel density for the same sized substrate can be increased, and displays with higher resolution (typically measured in pixel per inch (PPI)) can be achieved.

In some implementations, by fabricating the TFTs, and other components of the pixel circuit over or into the three-dimensional structures, parasitic capacitances between these components and other circuitry can be reduced.

FIG. 1A shows a schematic diagram of an example direct-view MEMS-based display apparatus 100. The display apparatus 100 includes a plurality of light modulators 102a-102d (generally light modulators 102) arranged in rows and columns. In the display apparatus 100, the light modulators 102*a* and 102*d* are in the open state, allowing light to pass. The light modulators 102*b* and 102*c* are in the closed state, obstructing the passage of light. By selectively setting the states of the light modulators 102*a*-102*d*, the display apparatus 100 can be utilized to form an image 104 for a backlit display, if illuminated by a lamp or lamps 105. In another implementation, the apparatus 100 may form an image by reflection of ambient light originating from the front of the apparatus. In another implementation, the apparatus 100 may form an image by reflection of light from a lamp or lamps positioned in the front of the display, i.e., by use of a front light.

In some implementations, each light modulator 102 corresponds to a pixel 106 in the image 104. In some other implementations, the display apparatus 100 may utilize a plurality of light modulators to form a pixel 106 in the image 104. For example, the display apparatus 100 may include three color-specific light modulators 102. By selectively opening one or more of the color-specific light modulators 102 corresponding to a particular pixel 106, the display apparatus 100 can generate a color pixel 106 in the image 104. In another example, the display apparatus 100 includes two or more light modulators 102 per pixel 106 to provide a luminance level in an image 104. With respect to an image, a pixel corresponds to the smallest picture element defined by the resolution of image. With respect to structural components of the display apparatus 100, the term pixel refers to the combined mechanical and electrical components utilized to modulate the light that forms a single pixel of the image.

The display apparatus 100 is a direct-view display in that it may not include imaging optics typically found in projection applications. In a projection display, the image formed on the surface of the display apparatus is projected onto a screen or onto a wall. The display apparatus is substantially smaller than the projected image. In a direct view display, the user sees the image by looking directly at the display apparatus, which contains the light modulators and optionally a backlight or front light for enhancing brightness and/or contrast seen on the display.

Direct-view displays may operate in either a transmissive or reflective mode. In a transmissive display, the light modulators filter or selectively block light which originates from a lamp or lamps positioned behind the display. The light from the lamps is optionally injected into a lightguide or backlight so that each pixel can be uniformly illuminated. Transmissive direct-view displays are often built onto transparent or glass substrates to facilitate a sandwich assembly arrangement where one substrate, containing the light modulators, is positioned over the backlight.

Each light modulator 102 can include a shutter 108 and an aperture 109. To illuminate a pixel 106 in the image 104, the shutter 108 is positioned such that it allows light to pass through the aperture 109 towards a viewer. To keep a pixel 106 unlit, the shutter 108 is positioned such that it obstructs the passage of light through the aperture 109. The aperture 109 is defined by an opening patterned through a reflective or light-absorbing material in each light modulator 102.

The display apparatus also includes a control matrix connected to the substrate and to the light modulators for controlling the movement of the shutters. The control matrix includes a series of electrical interconnects (such as interconnects 110, 112 and 114), including at least one write-enable interconnect 110 (also referred to as a scan-line interconnect) per row of pixels, one data interconnect 112 for each column of pixels, and one common interconnect 114 providing a common voltage to all pixels, or at least to pixels from both multiple columns and multiples rows in the display apparatus 100. In response to the application of an appropriate voltage (the write-enabling voltage, $V_{WE}$), the write-enable interconnect 110 for a given row of pixels prepares the pixels in the row to accept new shutter movement instructions. The data interconnects 112 communicate the new movement instructions in the form of data voltage pulses. The data voltage pulses applied to the data interconnects 112, in some implementations, directly contribute to an electrostatic movement of the shutters. In some other implementations, the data voltage pulses control switches, such as transistors or other non-linear circuit elements that control the application of separate actuation voltages, which are typically higher in magnitude than the data voltages, to the light modulators 102. The application of these actuation voltages then results in the electrostatic driven movement of the shutters 108.

Figure 1B:
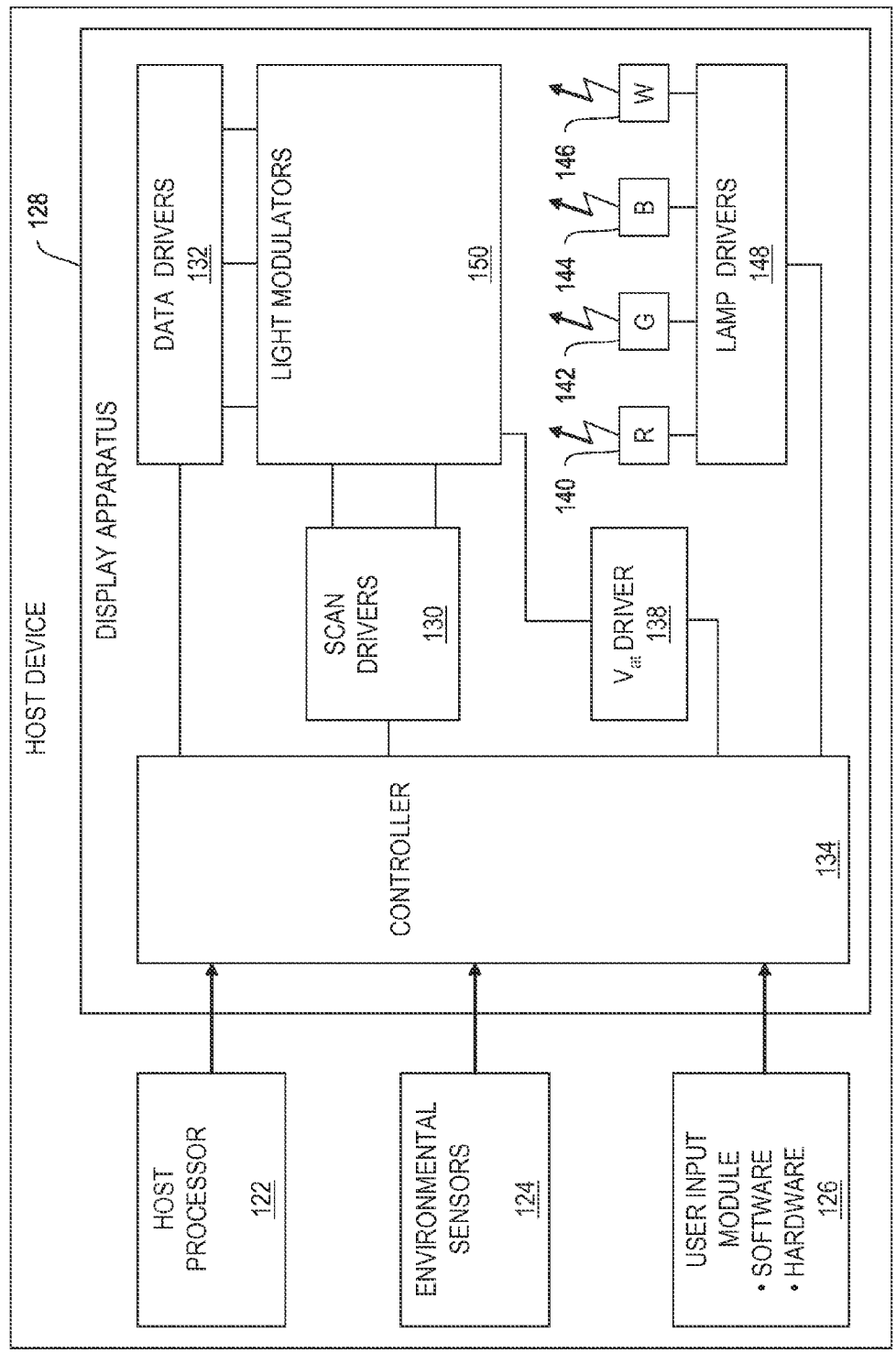
FIG. 1B shows a block diagram of an example host device.

FIG. 1B shows a block diagram of an example host device 120 (i.e., cell phone, smart phone, PDA, MP3 player, tablet, e-reader, netbook, notebook, watch, etc.). The host device 120 includes a display apparatus 128, a host processor 122, environmental sensors 124, a user input module 126, and a power source.

The display apparatus 128 includes a plurality of scan drivers 130 (also referred to as write enabling voltage sources), a plurality of data drivers 132 (also referred to as data voltage sources), a controller 134, common drivers 138, lamps 140-146, lamp drivers 148 and an array 150 of display elements, such as the light modulators 102 shown in FIG. 1A. The scan drivers 130 apply write enabling voltages to scan-line interconnects 110. The data drivers 132 apply data voltages to the data interconnects 112.

In some implementations of the display apparatus, the data drivers 132 are configured to provide analog data voltages to the array 150 of display elements, especially where the luminance level of the image 104 is to be derived in analog fashion. In analog operation, the light modulators 102 are designed such that when a range of intermediate voltages is applied through the data interconnects 112, there results a range of intermediate open states in the shutters 108 and therefore a range of intermediate illumination states or luminance levels in the image 104. In other cases, the data drivers 132 are configured to apply only a reduced set of 2, 3 or 4 digital voltage levels to the data interconnects 112. These voltage levels are designed to set, in digital fashion, an open state, a closed state, or other discrete state to each of the shutters 108.

The scan drivers 130 and the data drivers 132 are connected to a digital controller circuit 134 (also referred to as the controller 134). The controller sends data to the data drivers 132 in a mostly serial fashion, organized in sequences, which in some implementations may be predetermined, grouped by rows and by image frames. The data drivers 132 can include series to parallel data converters, level shifting, and for some applications digital to analog voltage converters.

The display apparatus optionally includes a set of common drivers 138, also referred to as common voltage sources. In some implementations, the common drivers 138 provide a DC common potential to all display elements within the array 150 of display elements, for instance by supplying voltage to a series of common interconnects 114. In some other implementations, the common drivers 138, following commands from the controller 134, issue voltage pulses or signals to the array 150 of display elements, for instance global actuation pulses which are capable of driving and/or initiating simultaneous actuation of all display elements in multiple rows and columns of the array 150.

All of the drivers (such as scan drivers 130, data drivers 132 and common drivers 138) for different display functions are time-synchronized by the controller 134. Timing commands from the controller coordinate the illumination of red, green, blue and white lamps (140, 142, 144 and 146 respectively) via lamp drivers 148, the write-enabling and sequencing of specific rows within the array 150 of display elements, the output of voltages from the data drivers 132, and the output of voltages that provide for display element actuation. In some implementations, the lamps are light emitting diodes (LEDs).

The controller 134 determines the sequencing or addressing scheme by which each of the shutters 108 can be re-set to the illumination levels appropriate to a new image 104. New images 104 can be set at periodic intervals. For instance, for video displays, the color images 104 or frames of video are refreshed at frequencies ranging from 10 to 300 Hertz (Hz). In some implementations the setting of an image frame to the array 150 is synchronized with the illumination of the lamps 140, 142, 144 and 146 such that alternate image frames are illuminated with an alternating series of colors, such as red, green, blue and white. The image frames for each respective color are referred to as color subframes. In this method, referred to as the field sequential color method, if the color subframes are alternated at frequencies in excess of 20 Hz, the human brain will average the alternating frame images into the perception of an image having a broad and continuous range of colors. In alternate implementations, four or more lamps with primary colors can be employed in display apparatus 100, employing primaries other than red, green, blue and white.

In some implementations, where the display apparatus 100 is designed for the digital switching of shutters 108 between open and closed states, the controller 134 forms an image by the method of time division grayscale, as previously described. In some other implementations, the display apparatus 100 can provide grayscale through the use of multiple shutters 108 per pixel.

In some implementations, the data for an image 104 state is loaded by the controller 134 to the display element array 150 by a sequential addressing of individual rows, also referred to as scan lines. For each row or scan line in the sequence, the scan driver 130 applies a write-enable voltage to the write enable interconnect 110 for that row of the array 150, and subsequently the data driver 132 supplies data voltages, corresponding to desired shutter states, for each column in the selected row. This process repeats until data has been loaded for all rows in the array 150. In some implementations, the sequence of selected rows for data loading is linear, proceeding from top to bottom in the array 150. In some other implementations, the sequence of selected rows is pseudo-randomized, in order to minimize visual artifacts. And in some other implementations, the sequencing is organized by blocks, where, for a block, the data for only a certain fraction of the image 104 state is loaded to the array 150, for instance by addressing only every $5^{th}$ row of the array 150 in sequence.

In some implementations, the process for loading image data to the array 150 is separated in time from the process of actuating the display elements in the array 150. In these implementations, the display element array 150 may include data memory elements for each display element in the array 150 and the control matrix may include a global actuation interconnect for carrying trigger signals, from common driver 138, to initiate simultaneous actuation of shutters 108 according to data stored in the memory elements.

In alternative implementations, the array 150 of display elements and the control matrix that controls the display elements may be arranged in configurations other than rectangular rows and columns. For example, the display elements can be arranged in hexagonal arrays or curvilinear rows and columns. In general, as used herein, the term scan-line shall refer to any plurality of display elements that share a write-enabling interconnect.

The host processor 122 generally controls the operations of the host. For example, the host processor 122 may be a general or special purpose processor for controlling a portable electronic device. With respect to the display apparatus 128, included within the host device 120, the host processor 122 outputs image data as well as additional data about the host. Such information may include data from environmental sensors, such as ambient light or temperature; information about the host, including, for example, an operating mode of the host or the amount of power remaining in the host's power source; information about the content of the image data; information about the type of image data; and/or instructions for display apparatus for use in selecting an imaging mode.

The user input module 126 conveys the personal preferences of the user to the controller 134, either directly, or via the host processor 122. In some implementations, the user input module 126 is controlled by software in which the user programs personal preferences such as deeper color, better contrast, lower power, increased brightness, sports, live action, or animation. In some other implementations, these preferences are input to the host using hardware, such as a switch or dial. The plurality of data inputs to the controller 134 direct the controller to provide data to the various drivers 130, 132, 138 and 148 which correspond to optimal imaging characteristics.

An environmental sensor module 124 also can be included as part of the host device 120. The environmental sensor module 124 receives data about the ambient environment, such as temperature and or ambient lighting conditions. The sensor module 124 can be programmed to distinguish whether the device is operating in an indoor or office environment versus an outdoor environment in bright daylight versus an outdoor environment at nighttime. The sensor module 124 communicates this information to the display controller 134, so that the controller 134 can optimize the viewing conditions in response to the ambient environment.

Figure 2:
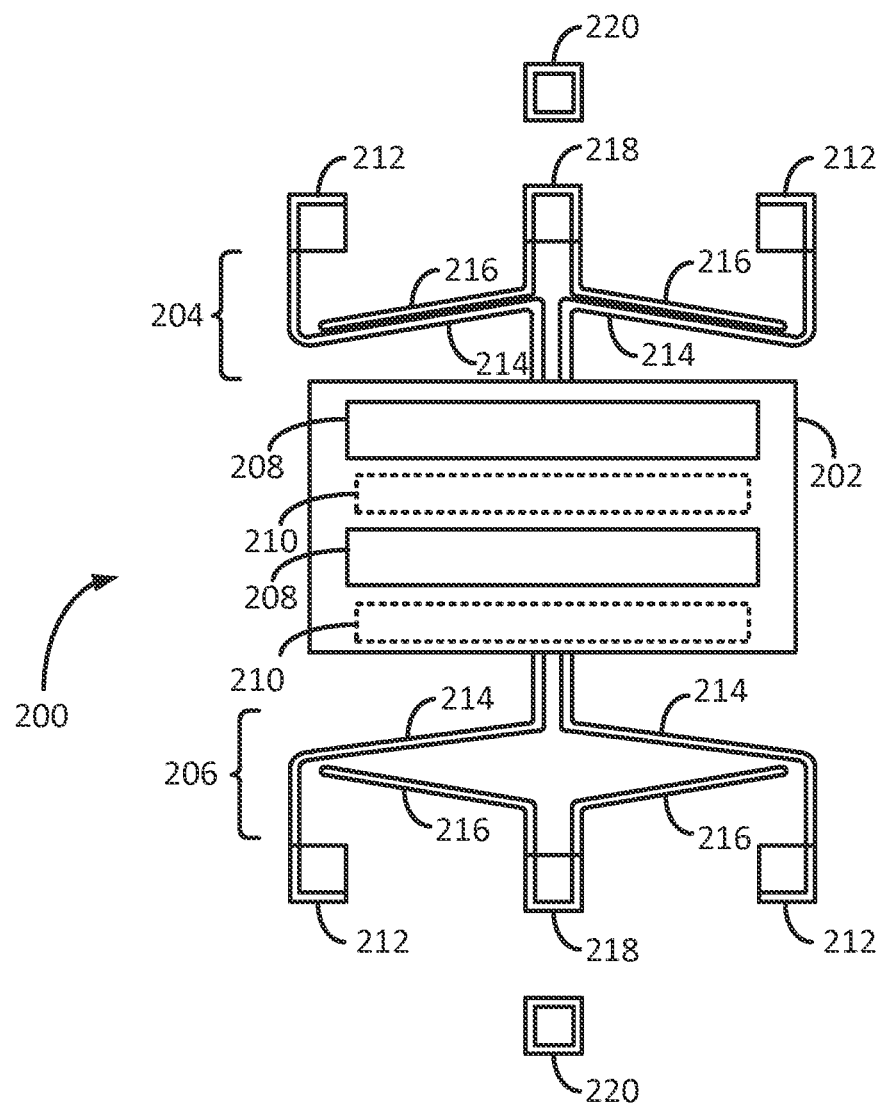
FIG. 2 shows a top view of an example shutter based light modulator.

FIG. 2 shows a top view of an example shutter based light modulator 200. In particular, FIG. 2 shows a light modulator 200 having actuators, each including two pairs of compliant beams. The light modulator 200 can include dual actuators for moving a shutter in opposing directions. The light modulator 200 can be suitable for incorporation into the direct view MEMS-based display apparatus 100 of FIG. 1A as the light modulator 102.

The light modulator 200 includes a shutter 202 coupled to a shutter-close actuator 204 and to a shutter-open actuator 206 (collectively referred to as "the actuators 204 and 206"). The shutter 202 includes shutter openings 208 through which light can pass through. By aligning or misaligning the shutter openings 208 with apertures 210 in an underlying aperture layer, the shutter 202 can transmit or block light emanating from the apertures 210 from reaching a viewer. When the shutter openings 208 are aligned with the apertures 208, the shutter 202 is said to be in an OPEN position. In the OPEN position, the shutter 202 allows substantially all light emanating from the apertures 210 to pass through towards the viewer. On the other hand, when the shutter openings are misaligned with the apertures 210, the shutter 202 is said to be in a CLOSED position. In the CLOSED position the shutter 202 blocks substantially all light emanating from the apertures 210 from reaching the viewer. In some implementations the shutter 202 can also be positioned in a partially CLOSED position, in which the shutter openings 208 are partially misaligned with the apertures 210. In the partially CLOSED position, the shutter 202 allows only a portion of the light emanating from the apertures 210 to reach the viewer. As an example, FIG. 2 shows the shutter 202 in a CLOSED position. That is, the shutter openings 208 are misaligned with the apertures 210.

The shutter 202 can be moved between the OPEN position and the CLOSED position by actuating the shutter-open actuator 206 and the shutter-close actuator 204. The shutter-open actuator 206 and the shutter-close actuator 204 are positioned on opposing ends of the shutter 202 such that the actuation of the shutter-open actuator 206 positions the shutter 202 in the OPEN position, while the actuation of the shutter-close actuator 204 positions the shutter 202 in the CLOSED position. The actuators 204 and 206 open and close the shutter 202 by pulling the shutter 202 substantially in a plane parallel to the aperture layer over which the shutter 202 is suspended. The shutter 202 is suspended a short distance over the aperture layer by load anchors 212 attached to the actuators 204 and 206. The inclusion of supports attached to both ends of the shutter 202 along its axis of movement reduces out of plane motion of the shutter 202 and confines the motion substantially to a plane parallel to the aperture layer.

As mentioned above, the shutter-close actuator 204 and the shutter-open actuator 206 each include two pairs of compliant beams. For example, each of the actuators 204 and 206 includes a pair of compliant load beams 214 and a pair of compliant drive beams 216. One end of each of the compliant load beams 214 is coupled to the shutter 202, while the other end of each of the compliant load beams 214 is coupled to the load anchor 212. One end of each of the drive beam 216 is coupled to a drive anchor 218 while the other end of each of the drive beams 216 is suspended in proximity with the opposing load beam 214.

The actuators 204 and 206 are actuated or de-actuated by applying or removing an actuation voltage across the compliant load beams 214 and the compliant drive beams 216. For example, to actuate the shutter-close actuator 204, a voltage difference equal to an actuation voltage is applied between the compliant load beams 214 and the compliant drive beams 216 of the shutter-close actuator 204. The application of the actuation voltage results in the generation of electrostatic forces between the compliant load beams 214 and the corresponding compliant drive beams 216. The electrostatic forces cause the compliant load beams 214, and in turn the shutter 202, to move towards the drive beams 216. As a result, the shutter 202 is positioned in a CLOSED state. Once the shutter-close actuator 204 has been actuated, the voltage difference between its compliant load beams 214 and the compliant drive beams 216 can be reduced to a lower maintenance voltage, which can maintain the position of the shutter over the presence of a greater opposing voltage being applied to the shutter-open actuator 206.

The shutter-open actuator 206 can be actuated in a manner similar to the one described above with respect to the shutter-close actuator 204. For example, assuming that the voltage on the shutter-close actuator 204 is less than the maintenance voltage referred to above, the shutter-open actuator 206 can be actuated by applying an actuation voltage across its compliant load beams 214 and the compliant drive beams 216. In this case, the shutter 202 is pulled in the opposite direction moving the shutter 202 into the OPEN position. After actuation, the voltage difference between the compliant load beams 214 and the compliant drive beams 216 of the shutter-open actuator 206 can be reduced to a maintenance voltage.

In some implementations, the voltage applied to the compliant load beams 214, and in turn the shutter 202, is kept constant. In such implementations, appropriate voltages can be applied to the respective compliant drive beams 216 of the actuators 204 and 206 based on which of the actuators 204 and 206 is to be actuated. For example, to actuate the shutter-close actuator 204, the voltage at the compliant load beams 214 and the shutter 202 can be maintained at zero volts and the voltage at the compliant drive beams 214 of the shutter-close actuator 204 can be raised to the actuation voltage.

In some other implementations, the voltage applied to the compliant drive beams 216 of both the actuators 204 and 206 are maintained at constant, but different voltages (such as a high voltage and a low voltage). In such implementation, an appropriate voltage is applied to the compliant load beams 214 and the shutter 202 to actuate one of the first actuators 204 and 206.

In some implementations, spacers 220 can be placed in the vicinity of the light modulator. In some implementations, a display device can include a second substrate in addition to the substrate on which the light modulator 200 is fabricated. The second substrate can also include MEMS structures. The two substrates are laid on top of each other, with their sides over which their respective MEMS structures are built facing each other. The spacers 220 serve to maintain a safe distance between the two substrates. The top surfaces of the spacers 220 come in contact with corresponding spacers on the other substrate. The spacers 220 are three-dimensional structures having a number of sidewalls.

As will be discussed below, TFTs can be fabricated into the sidewalls of the spacers 220 or into the load anchors 212 and the drive anchors 218 supporting the compliant load beams 214 and the compliant drive beams 216.

Figure 3:
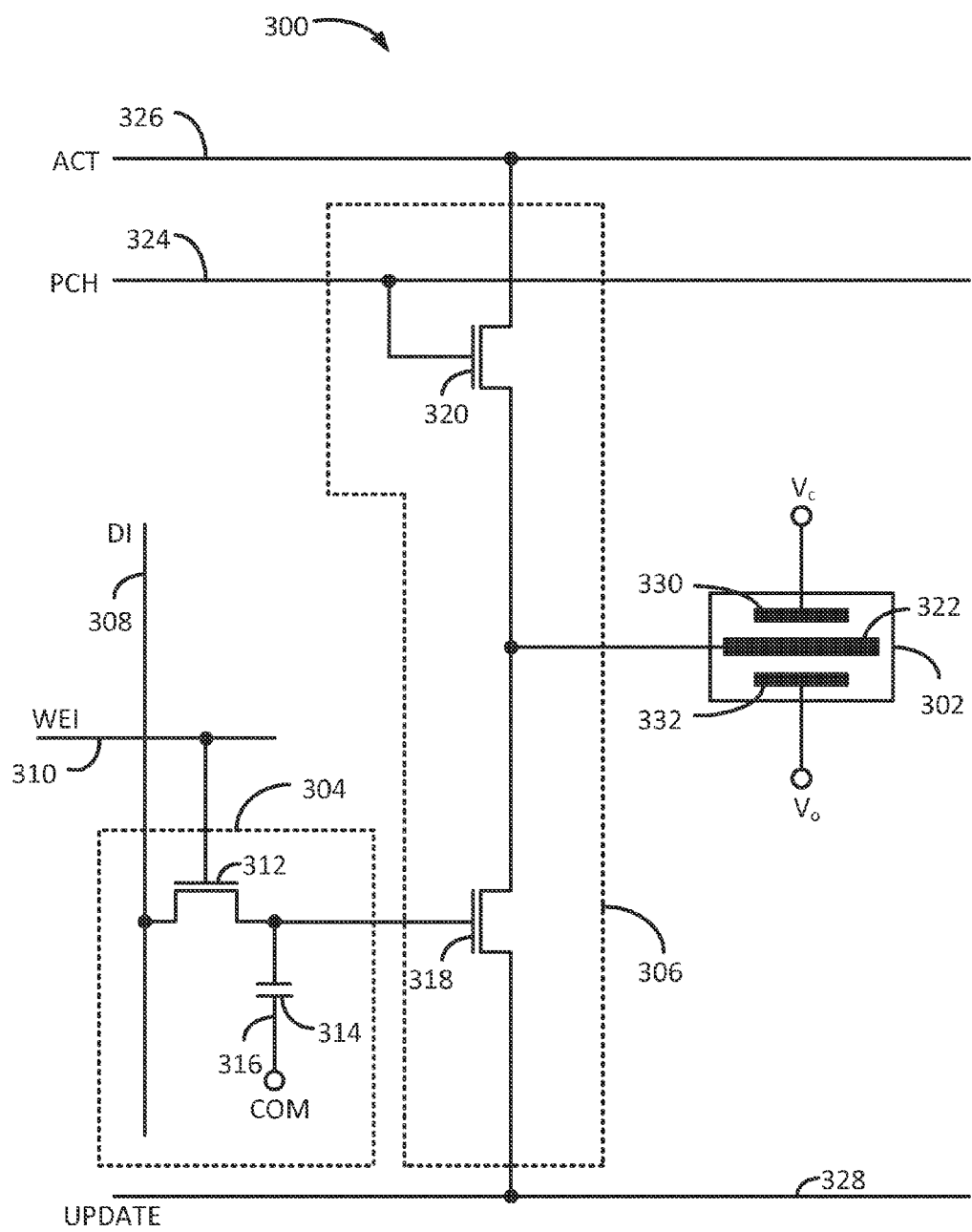
FIG. 3 shows an example pixel circuit 300 that can be implemented for controlling a light modulator.

FIG. 3 shows an example pixel circuit 300 that can be implemented for controlling a light modulator. In particular, the pixel circuit 300 can be used to control dual actuator light modulators, such as the light modulator 200 shown in FIG. 2. The pixel circuit can be part of a control matrix that controls an array of pixels that incorporate light modulators similar to the light modulator 200.

The pixel circuit 300 includes a data loading circuit 304 coupled to an actuation circuit 306. The data loading circuit 304 receives and stores data associated with the pixel, while the actuation circuit 306 actuates the light modulator 302 based on the data stored by the data loading circuit 304. In some implementations, various components of the pixel circuit 300 are implemented using TFTs. In some implementations, TFTs manufactured using materials such as amorphous-silicon, indium-gallium-zinc-oxide, or polycrystalline-silicon may be used. In some other implementations, various components of the pixel circuit 300 are implemented using MOSFETs. As will be readily understood by a person having ordinary skill in the art, TFTs are three terminal transistors having a gate terminal, source terminal, and a drain terminal. The gate terminal can act as a control terminal such that a voltage applied to the gate terminal in relation to the source terminal can switch the TFT ON or OFF. In the ON state, the TFT allows electrical current to flow from the source terminal to the drain terminal. In the OFF state, the TFT substantially blocks any current flow from the source to the drain. The implementation of the pixel circuit 300, however, is not limited to TFTs or MOSFETS, and other transistors such as bipolar junction transistors also may be utilized.

As mentioned above, the data loading circuit 304 is used to load data associated with the pixel. Specifically, the data loading circuit 304 is coupled to a data interconnect (DI) 308, which is common to all the pixels in the same column of the array of pixels. The data interconnect 308 is energized with a data voltage corresponding to the data to be loaded into the pixel. In some implementations, the data voltage can be a voltage between a minimum data voltage, such as ground, and a maximum data voltage. In some such implementations, the minimum data voltage and the maximum data voltage can represent one bit of digital data, i.e., a '0' or a '1'. In some implementations, the data voltage can be a function of a pixel intensity value corresponding to that pixel.

The data loading circuit 304 is also coupled to a write enabling interconnect (WEI) 310, which is common to all pixels in the same row of the array as the pixel associated with the pixel circuit 300. When the write enabling interconnect 310 is energized with a write enabling voltage, the data loading circuit 304 accepts data provided on the data interconnect 308.

To accomplish the data loading function, the data loading circuit 304 includes a write enabling transistor 312 and a data storage capacitor 314. The write enabling transistor 312 can be a controllable transistor switch, the operation of which can be controlled by the write enabling voltage on the write enabling interconnect 310. The first terminal, or the gate terminal, of the write enabling transistor 312 can be coupled to the write enabling interconnect 310. The second terminal (drain/source terminal) of the write enabling transistor 312 can be coupled to the data interconnect 308, while the third terminal (drain/source terminal) can be coupled to the data storage capacitor 314. The data storage capacitor 314 can be used to store the data voltage that is representative of the data provided by the data interconnect 308. One terminal of the data storage capacitor 314 is coupled to the write enabling transistor 312, while the other terminal of the data storage capacitor 314 is coupled to a common interconnect (COM) 316. The common interconnect 316 provides a common ground voltage, or some other reference voltage, to pixels in multiple rows and columns of the display apparatus.

As mentioned above, the data loading circuit 304 is coupled to the actuation circuit 306. Specifically, the data storage capacitor 314 of the data loading circuit 304 is coupled to the gate terminal of a discharge transistor 318 of the actuation circuit 306. The actuation circuit 306 includes a charge path and a discharge path. The charge path includes a precharge transistor 320 and the discharge path includes the discharge transistor 318. The charge path and the discharge path are used to change a voltage applied to a shutter terminal 322 of the light modulator 302. The gate terminal of the precharge transistor 320 is coupled to a precharge interconnect (PCH) 324, while the other two (source/drain) terminals of the precharge transistor are coupled to an actuation interconnect (ACT) 326 and to the shutter terminal 322 of the light modulator 302. When a precharge voltage is applied to the precharge interconnect 324, the precharge transistor switches ON, causing the shutter terminal 322 to be charge to an actuation voltage maintained on the actuation interconnect 326.

One of the source/drain terminals of the discharge transistor 318 is coupled to the shutter terminal 322 of the light modulator 302 while the other of the source/drain terminals is coupled to an update interconnect (UPDATE) 328. When a voltage on the update interconnect 328 is lowered, the discharge transistor 318 discharges the shutter terminal 322 based on the data voltage stored in the data storage capacitor 314. For example, if the data voltage stored in the data voltage capacitor is high, then the discharge transistor 318 can switch ON and discharge the shutter terminal 322. On the other hand, if the data voltage is low (i.e., below the threshold voltage of the discharge transistor 318), then the discharge transistor 318 can be switched OFF.

The light modulator 302, in addition to the shutter terminal 322, also includes a shutter-close actuator terminal 330 and a shutter-open actuator terminal 332. The shutter-close actuator terminal 330 and the shutter-open actuator terminal 332 can be coupled to dual actuators of a dual actuator light modulator. For example, referring to the dual actuator light modulator 200 shown in FIG. 2, the shutter-close actuator terminal 330 and the shutter-open actuator terminal 332 can be electrically coupled to the drive beams 216 of the first shutter-close actuator 204 and the first shutter-open actuator 206, respectively. Furthermore, the shutter terminal 322 can be coupled to the load beams 214 and the shutter 202.

The shutter-close actuator terminal 330 and the shutter-open actuator terminal 332 can be maintained at substantially constant but different voltages. For example, the shutter-close actuator terminal 330 can be maintained at a constant voltage of $V_c$, while the shutter-open actuator terminal 332 can be maintained at a constant voltage of $V_o$. The voltage on the shutter terminal 322, which is determined by the pixel circuit 300 based on the data voltage, determines which one of the light modulator's shutter-close actuator and the shutter-open actuator is actuated. In some implementations, if the voltage difference between the shutter terminal 322 and the shutter-close actuator terminal 330 is substantially equal to an actuation voltage, then the shutter-close actuator is actuated and the shutter is moved to a CLOSED position. On the other hand, if the voltage difference between the shutter terminal 322 and the shutter-open actuator terminal 332 is substantially equal to the actuation voltage, then the shutter-open actuator is actuated and the shutter is moved to an OPEN position. In some implementations, voltage $V_c$ can be maintained at a voltage that is equal to the actuation voltage while the voltage $V_o$ is maintained at ground or zero volts. In some other implementations, voltage $V_c$ can be maintained at zero volts while the voltage $V_o$ can be maintained at a voltage that is equal to the actuation voltage.

During operation, the actuation interconnect 326 can be maintained at an actuation voltage. At the beginning of a frame period (during which an image frame is displayed) the update interconnect 328 is brought to a high voltage that is sufficient to maintain the discharge transistor 318 in an OFF state irrespective of the voltage at the discharge transistor's 318 gate terminal. Subsequently, the data interconnect 308 is brought to a data voltage that corresponds to the data to be loaded into the pixel circuit and the write enable interconnect 310 is energized with a voltage that is sufficient to switch the write enable transistor 312 ON. This causes the data storage capacitor 314 to be charged or discharged such that the voltage on the data storage capacitor 314 is substantially equal to the data voltage.

After loading the data, the voltage on the precharge interconnect 324 is brought sufficiently high to switch the precharge transistor 320 ON. This causes the shutter terminal 322 to be charged to a voltage substantially equal to the actuation voltage. If the voltage $V_o$ at the shutter-open actuator terminal 332 is maintained at zero volts, the shutter-open actuator would be actuated, and the shutter would be moved into an OPEN position. On the other hand, if the voltage $V_c$ at the shutter-close actuator terminal 330 instead is maintained at zero volts, then the shutter-close actuator would be actuated, and the shutter would be moved into a CLOSED position. Thereafter, the voltage on the precharge interconnect 324 is brought sufficiently low to switch the precharge transistor 320 OFF. In some implementations, this voltage can be about ground voltage.

When the voltage on the update interconnect 328 is brought to a low level (typically less than the ground voltage) the discharge transistor 318 can assume a state based on the data voltage stored in the data storage capacitor 314. If the data voltage is sufficiently high to switch the discharge transistor ON, then the shutter terminal 322, which was previously precharged to the actuation voltage, is discharged via the discharge transistor 318. This causes the voltage on the shutter terminal 322 to be pulled low. As mentioned above, the voltage difference between the shutter terminal 322 and each of the shutter-open actuator terminal 330 and the shutter-close actuator terminal 332 determines which one of the dual actuators of the light modulator is actuated. Thus, for example, if the shutter voltage is pulled low, and $V_c$ is being maintained at the actuation voltage, then the voltage difference between the shutter terminal 322 and the shutter-close terminal 330 will be equal to the actuation voltage. As a result, the shutter-close actuation would be actuated causing the shutter to move to a CLOSED position.

In some implementations, to reduce charge accumulation at the actuators, the magnitude of voltages $V_c$ and $V_o$ on the shutter-close actuator terminal 322 and the shutter-open actuator terminal 330 can be periodically reversed. For example, the $V_c$ can be maintained at near ground voltage while $V_o$ can be maintained at the actuation voltage. Thus, if the shutter voltage is pulled low, the shutter-open actuator would be actuated causing the shutter to move to the OPEN position. To maintain the relationship between the data input and the position of the shutter when the voltages on the shutter-close actuator terminal 322 and the shutter-open actuator terminal 330 are reversed, the data voltage on the data interconnect 308 can be inverted before being applied to the data loading circuit 304.

Various components of the pixel circuit 300, including the write enable transistor 312, the data storage capacitor 314, the precharge transistor 320 and the discharge transistor 318, are typically fabricated on the same substrate on which the light modulator 302 is built. As display apparatus are developed to improve pixel resolution by increasing pixel density, the amount of space available per pixel on the substrate to accommodate pixel circuitry to control each pixel becomes increasingly limited. This challenge becomes particularly acute for pixel circuits having multiple active components, such as the pixel circuit 300.

In some implementations, the area of the substrate occupied by a pixel circuit can be reduced if portions of the pixel circuit can be built in three dimensions. For example, in some implementations, EMS displays incorporate structures that extend outward from the surface of the substrate at relatively high aspect ratios. Incorporating circuit components, such as transistors, into such structures can potentially reduce the area occupied by the circuit components within the plane of the substrate.

Figure 4A:
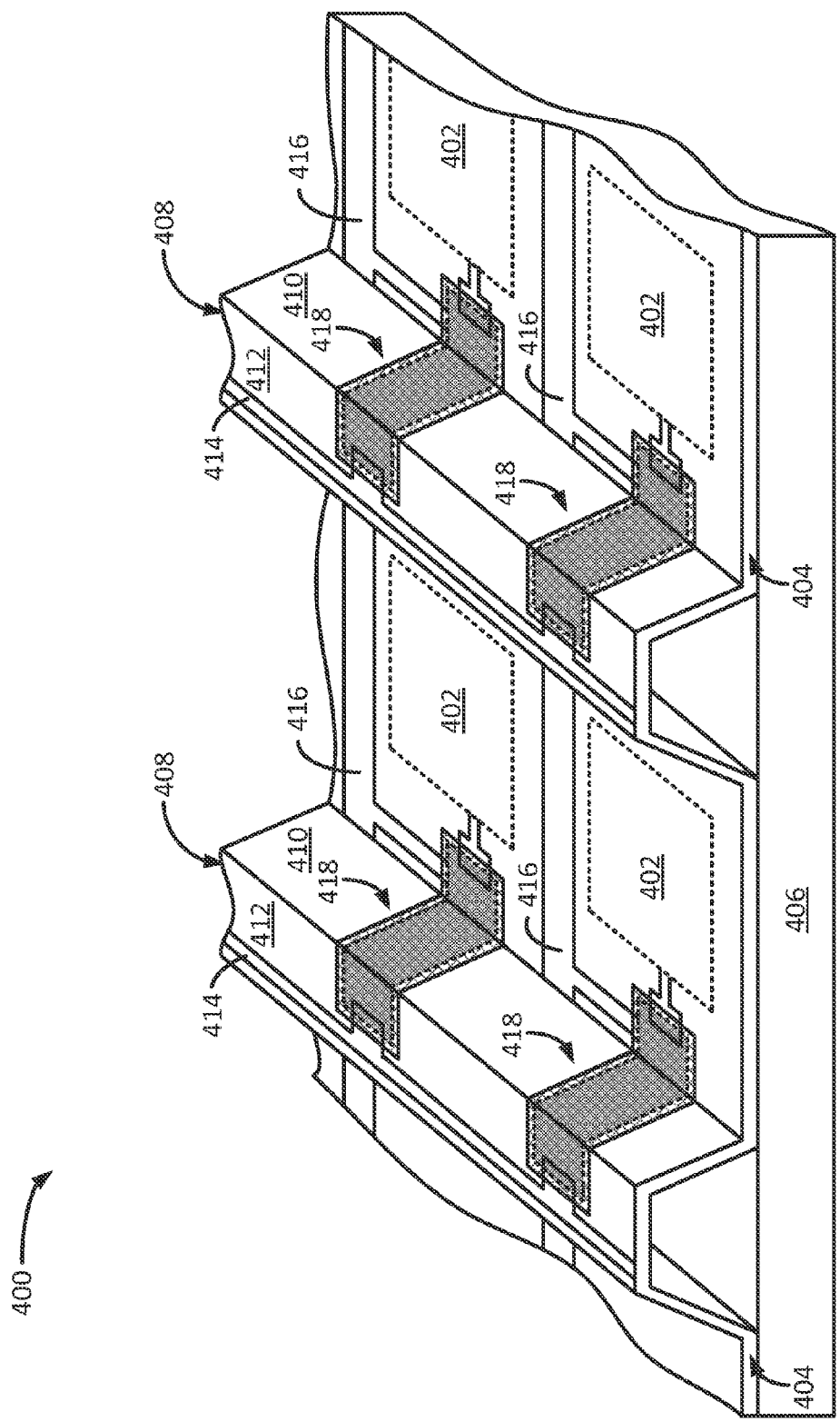
FIGS. 4A and 4B show isometric views of a portion of an example display apparatus 400 having three-dimensional thin-film-transistors (TFTs).
Figure 4B:
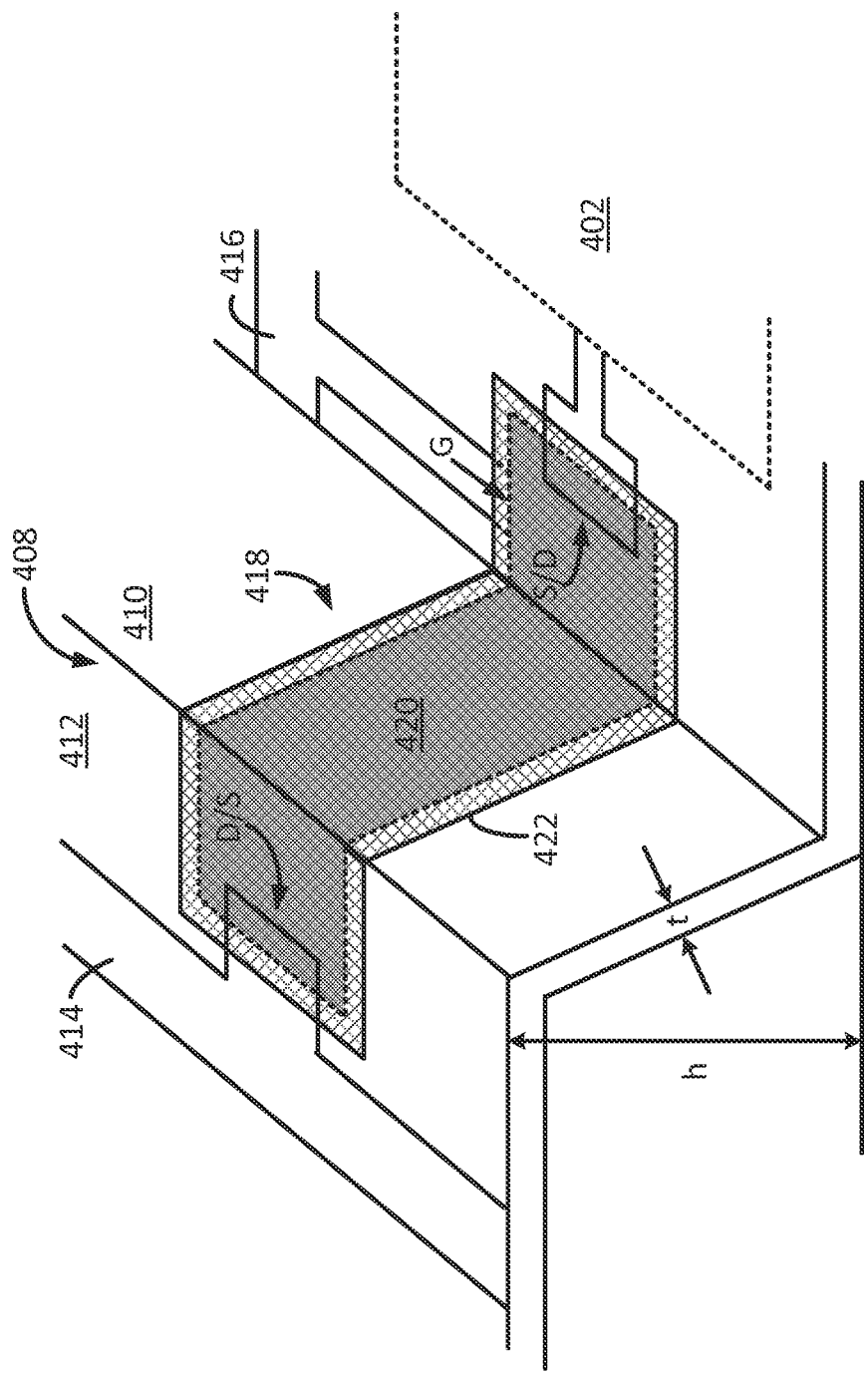

FIGS. 4A and 4B show isometric views of a portion of an example display apparatus 400 having three-dimensional TFTs. In particular, the display apparatus 400 can include raised structures into which TFTs can be built. The display apparatus 400 includes an array of pixels 402. Each pixel can include one or more light modulators and corresponding pixel circuitry. In some implementations, the dual actuator light modulator 200 shown in FIG. 2 and the pixel circuit 300 shown in FIG. 3 can be incorporated into the pixels 402. The display apparatus 400 can also include MEMS structures 404 fabricated on a transparent substrate 406 (made, for example, from glass or plastic). The MEMS structures can include a plurality of layers of materials, conductors, semiconductors, dielectrics, etc. The MEMS structures can also include a plurality of raised structures 408 that extend outward from the surface of the substrate 406. The raised structures 408 include at least one sidewall 410 and a top surface 412. The sidewall 410 can be positioned at a relatively steep angle with respect to the substrate 406, and can have a relatively high aspect ratio, for example, greater than 4:1; however, it is understood that raised structures 408 can be fabricated with sidewall 410 having various other angles with respect to the plane of the substrate 406 as well as other aspect ratios.

The display apparatus 400 can also include a plurality of interconnects to carry electrical signals to and from the pixels 402. A subset of these interconnects is shown in FIG. 4A. In particular, FIG. 4A shows the display apparatus 400 having a plurality of data interconnects 414 and a plurality of write enable interconnects 416. In some implementations, the data interconnects 414 and the write enable interconnects 416 shown in FIG. 4A can be used to implement the data interconnects 112 and the write enable interconnects 110, respectively, discussed above with reference to FIG. 1A. In some other implementations, the data interconnects 414 and the write enable interconnects 416 shown in FIG. 4A can be used to implement the data interconnect 308 and the write enable interconnect 310, respectively, shown in FIG. 3. The interconnects can be arranged such that one data interconnect 414 is associated with each column of the array of pixels 402 while one write enable interconnect 416 is associated with each row of the array of pixels 402 of the data apparatus 400. In some implementations, such as the one shown in FIG. 4A, the data interconnects 414 can be fabricated over the top surfaces 412 of the raised structures 408. By fabricating the data interconnects 414 on the top surface of the raised structures 408, capacitance between the data interconnects 414 and other interconnects or conductors fabricated over the substrate 406, beneath the raised structure 408, can be reduced.

In some implementations, at least one component of the pixels 402 can be fabricated over or into the sidewalls 410 of the raised structures 408. For example, in FIG. 4A, a write enable transistor 418 of each pixel 402 is fabricated on the sidewall 410 of an adjacent raised structure 408. The write enable transistor 418 can be similar to the write enable transistor 312 of the pixel circuit 300 shown in FIG. 3. It is understood that in some other implementations, components other than the write enable transistor 418 can be fabricated on or into the sidewall 410.

An expanded view of the write enable transistor 418 fabricated on the sidewall 410 of the raised structure 408 is shown in FIG. 4B. In some implementations, the write enable transistor 418 can be a TFT. In some implementations, the write enable transistor 418 can be a bottom gate TFT transistor. In such implementations, the gate of the TFT transistor is fabricated between an active semiconductor layer and the substrate 406. In other implementations, the write enable transistor 418 can be a top gate TFT transistor, where the gate is fabricated on top of the active semiconductor layer, which in turn is fabricated over the substrate. The gate (G) 420 of the write enable transistor 418 is coupled to the write enable interconnect 416. The gate 420 can include a layer of conductive material and a layer of insulating material. As the write enable transistor 418 is a bottom gate TFT, the insulating layer is deposited on top of the conductive layer. In this manner, the conductive layer of the gate 420 is insulated from an active semiconductor layer 422. The conductive layer of the gate 420 is used to electrically couple the gate 420 to the write enable interconnect 416. Conductive materials such as, but not limited to, indium-tin-oxide (ITO), Al, or Ti can be utilized to form the conductive layer of the gate 420. Insulating materials such as silicon nitride (SiNx) and/or silicon dioxide ($SiO_2$) can be utilized to form the insulating layer of the gate 420.

One of the source/drain terminals of the write enable transistor 418 is coupled to the data interconnect 414, while the other of the source/drain terminals is coupled to the remainder of the pixel circuitry of the pixel 402. The active semiconductor 422 selectively provides a channel between the two source/drain terminals of the write enable transistor 418 depending upon the voltages applied to its terminals. Materials such as, but not limited to, amorphous semiconductors, amorphous silicon (a-Si), indium gallium zinc oxide (IGZO), indium gallium oxide (IGO), zinc indium oxide (ZIO), zinc tin oxide (ZTO), microcrystalline silicon, polycrystalline silicon, etc. can be used for implementing the active semiconductor 422. When a voltage exceeding a threshold voltage is applied to the gate 420 of the write enable transistor 418, the active semiconductor 422 allows current to flow between the two source/drain terminals. Thus, when a write enable voltage is applied to the write enable interconnect 416, the write enable transistor 418 is switched ON and results in the data voltage on the data interconnect 414 being loaded into the pixel 402.

The operation of the write enable transistor 418 fabricated on the sidewall 410 is thus similar to the operation of a similar sized write enable transistor that could be fabricated entirely on the substrate 406. However, the write enable transistor 418 occupies relatively less area within the plane of the substrate 406. This reduces the substrate area needed per pixel. As a result, pixel density (typically measured in pixels-per-inch (PPI)) can be increased. In some implementations, the height (h) to thickness (t) ratio of the transistors 418 can be at least about 1.4:1. In some other implementations, the height to thickness ratio can be as much as or greater than about 4:1.

While FIG. 4A shows the fabrication of a TFT over the sidewall of the raised MEMS structure 408, it is understood that the TFT can be fabricated on or into the sidewalls other MEMS structures as well. For example, the TFT can be fabricated on or into the sidewalls of an anchor or a spacer. Referring to FIG. 2, the light modulator 200 includes load anchors 212, which support the shutter 202 and the load beams 214, drive anchors 218, which support the drive beams 216, and spacers 220. These anchors and spacers 220 can also include sidewalls that form an angle with the underlying substrate. As such, the sidewalls of these anchors and spacers can be utilized for fabricating TFTs.

Figure 5A:
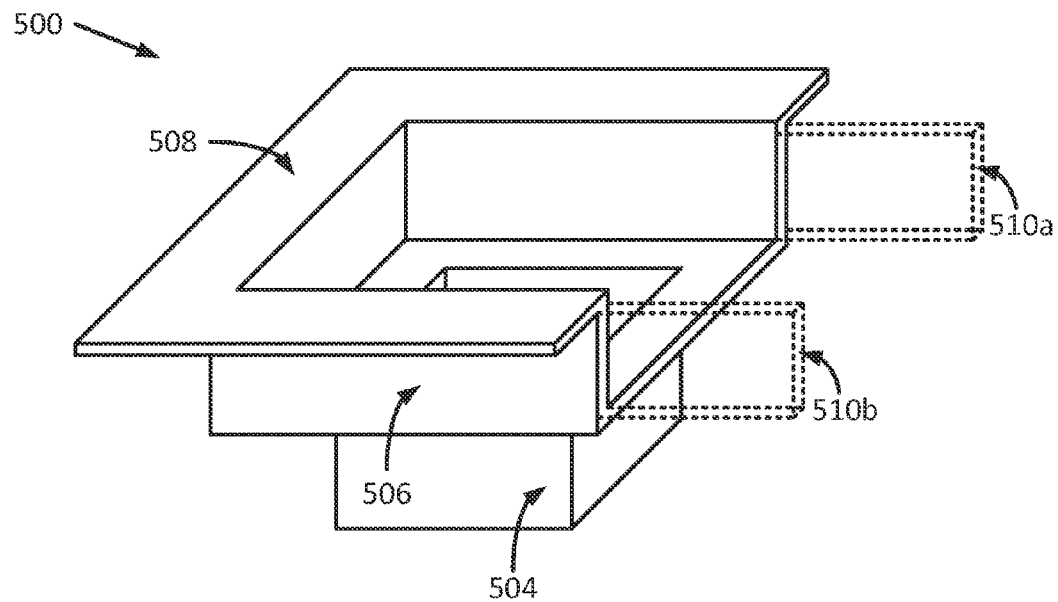
FIGS. 5A and 5B show isometric views of two example anchors having TFTs fabricated into their sidewalls.
Figure 5B:
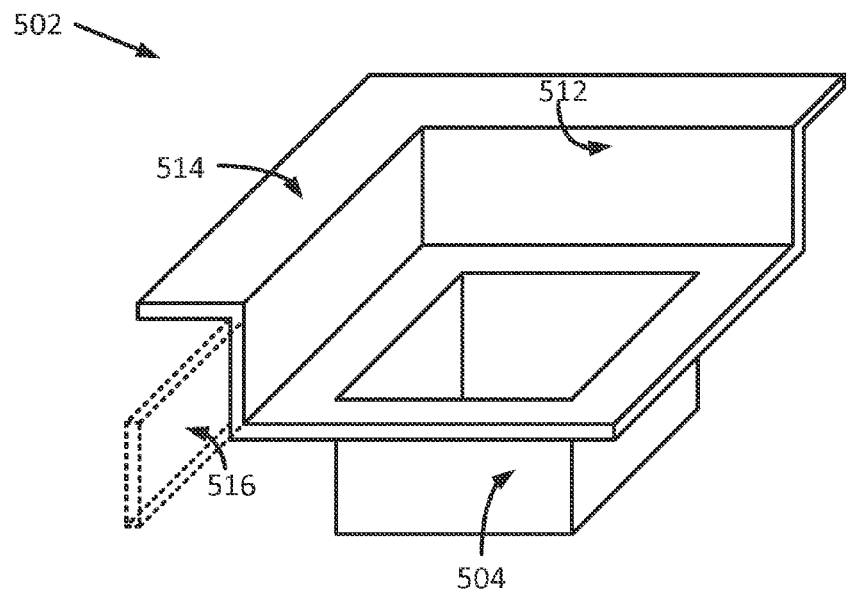

FIGS. 5A and 5B show isometric views of two example anchors having TFTs incorporated into their structure. In particular, FIG. 5A shows a U-shaped anchor 500 and FIG. 5B shows an L-shaped anchor 502. In some implementations, the U-shaped anchor 500 shown in FIG. 5A can be used to implement the drive anchor 218 in the light modulator 200 shown in FIG. 2. In some implementations, the L-shaped anchor 502 can be used to implement the load anchor 212 in the light modulator 200 shown in FIG. 2.

The U-shaped anchor 500 includes a base portion 504, a top portion 506 and a shelf 508. The base portion 504 can be coupled to a substrate over which the U-shaped anchor 500 is formed, and provides support and adhesion to the substrate. In some implementations, such as the one shown in FIG. 5A, the base portion 504 is four-sided, unlike the three-sided top portion 506. In some other implementations, the base portion 504 can also be three sided like the top portion 506. The base portion 504 and the top portion 506 can be formed over the sides of a patterned mold formed by one or more sacrificial material. The shelf 508, which extends outward substantially horizontally from the top portion 506, can be formed over the top surface of the mold. The U-shaped anchor 500 also includes a first compliant beam 510a and a second compliant beam 510b extending outwards from the top portion 506. For sake of clarity, only portions of the first and second compliant beams 510a and 510b are shown in FIG. 5A using broken lines. In some implementations, the first and second compliant beams 510a and 510b in FIG. 5A can form the compliant drive beams 216 shown in FIG. 2. The sizes and thicknesses of the base portion 504, the top portion 506 and the shelf 508 can be selected to provide the desired stiffness to the first and second compliant beams 510a and 510b.

Any portion of the U-shaped anchor 500 can form a portion of a TFT. In some implementations, the TFT can extend from the substrate over which the U-shaped anchor 500 is formed through the base portion 504, the top portion 506 up to the shelf 508. For example, in some implementations, one source/drain terminal of the TFT can be formed into the base portion 504, the gate terminal, including a semiconductor channel can be formed into the top portion 506, while the other of the source/drain terminal can be formed into the shelf 508. In some implementations, one or more sides of the U-shaped anchor 500 may be utilized for forming the same TFT. Such a configuration may be beneficial when TFTs of large channel widths are desired.

Similar to the U-shaped anchor 500 shown in FIG. 5A, The L-shaped anchor 502 shown in FIG. 5B also includes a base portion 504. However, unlike the three sided top portion 506 of the U-shaped anchor 500, the L-shaped anchor 502 includes a two-sided top portion 512 disposed between the base portion 504 and a two-sided shelf 514. In some implementations, the base portion 504 may include only two sides. In some implementations, a third compliant beam 516 can extend outwards from the two-sided top portion 512. For clarity, only a portion of the third compliant beam 516 is shown in FIG. 5B (using broken lines). In some implementations, the third compliant beam 516 can be utilized as the compliant load beam 214 of the light modulator 200 shown in FIG. 2.

Any portion of the L-shaped anchor 502 can form a portion of a TFT. In some implementations, the base portion 504, the two-sided top portion 512 and the two-sided shelf 514 can be formed of one or more portions of the TFT. In some implementations, one of the source/drain terminals of the TFT can be formed on the substrate over which the L-shaped anchor 502 is formed, the gate terminal in addition to a channel semiconductor can be formed as the two-sided top portion 512 while the other of the source/drain terminal can be formed as the two-sided shelf 514. In some implementations, more than one side of the L-shaped anchor 502 can be utilized for forming the same TFT.

In some implementations, one or more of the TFTs of the pixel circuit 300 shown in FIG. 3 can be formed into the U-shaped anchor 500 and the L-shaped anchor 502. In particular, in some implementations, one or more of the write enable transistor 312, the precharge transistor 320 and the discharge transistor 318 can be fabricated on or into the U-shaped anchor 500. In some implementations, the precharge transistor 320 and the discharge transistor 318 can be formed into two separate U-shaped anchor 500 or L-shaped anchors 502, where the anchors provide support to the shutter of the light modulator 302.

The fabrication of one or more TFTs on or into one or more sidewalls of the U-shaped anchor 500 shown in FIG. 5A and the L-shaped anchor 502 shown in FIG. 5B can reduce the area occupied by the TFTs within the plane of the substrate.

This reduces the substrate area needed per pixel. As a result, pixel density (typically measured in pixels-per-inch (PPI)) can be increased.

In some implementations, one or more TFTs can be fabricated on or into one or more sidewalls of spacers. For example, TFTs can be fabricated on or into the sidewalls of spacers 220 shown in FIG. 2. Fabricating TFTs on the sidewalls of spacers 220 further reduces the substrate area needed per pixel. For example, in some implementations, the write enable transistor 312 can be fabricated on or into one or more sidewalls of the spacer 220.

FIG. 6A-6J show example cross-sectional views of the results of various manufacturing stages of an example process to form an anchor 600 incorporating a TFT into its structure. The anchor 600 can be utilized as a supporting MEMS structure in display devices. In some other implementations, the manufacturing stages shown in FIGS. 6A-6J can be utilized to form TFTs on or into the U-shaped and L-shaped anchors 500 and 502 shown in FIGS. 5A and 5B, respectively.

Figure 6D:
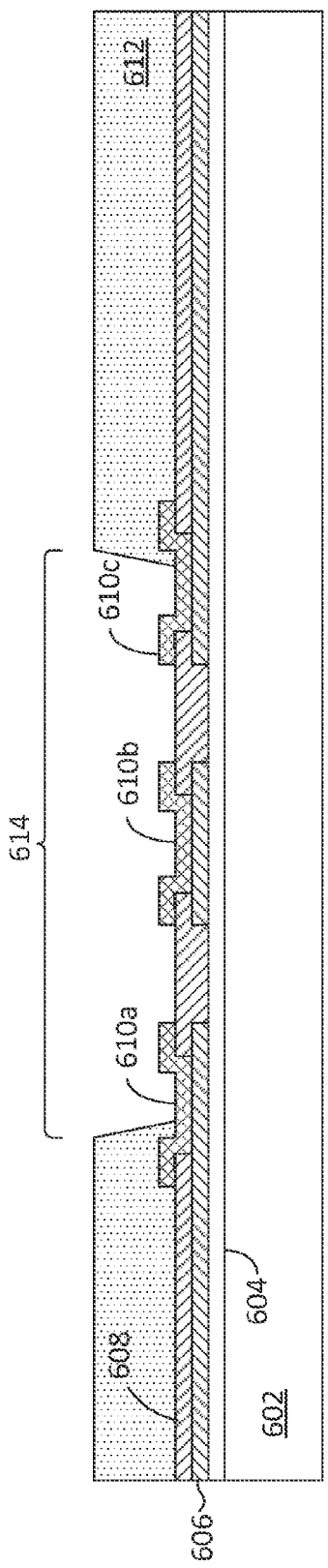
Figure 6E:
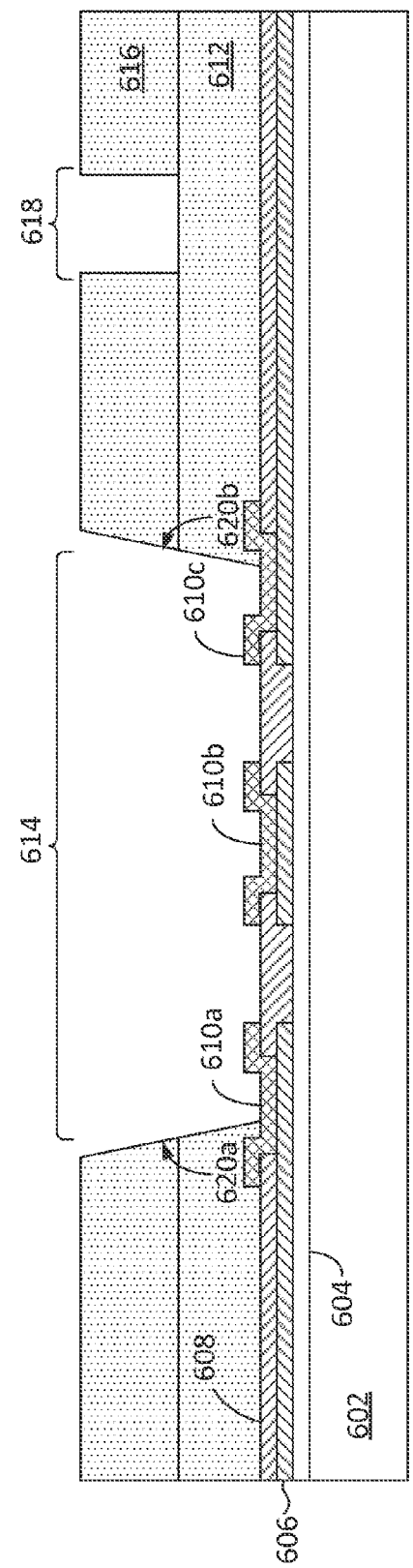
Figure 6F:
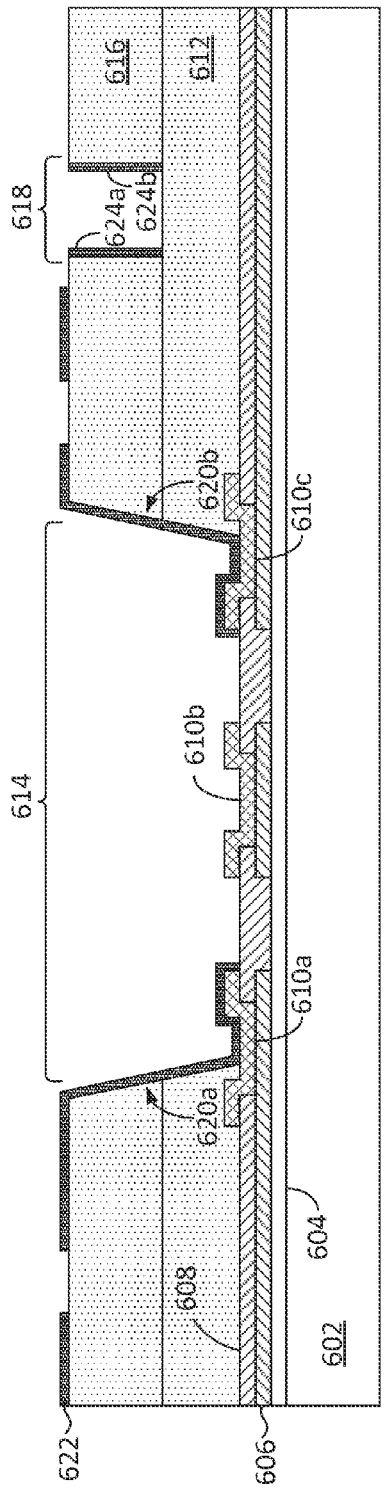
Figure 6G:
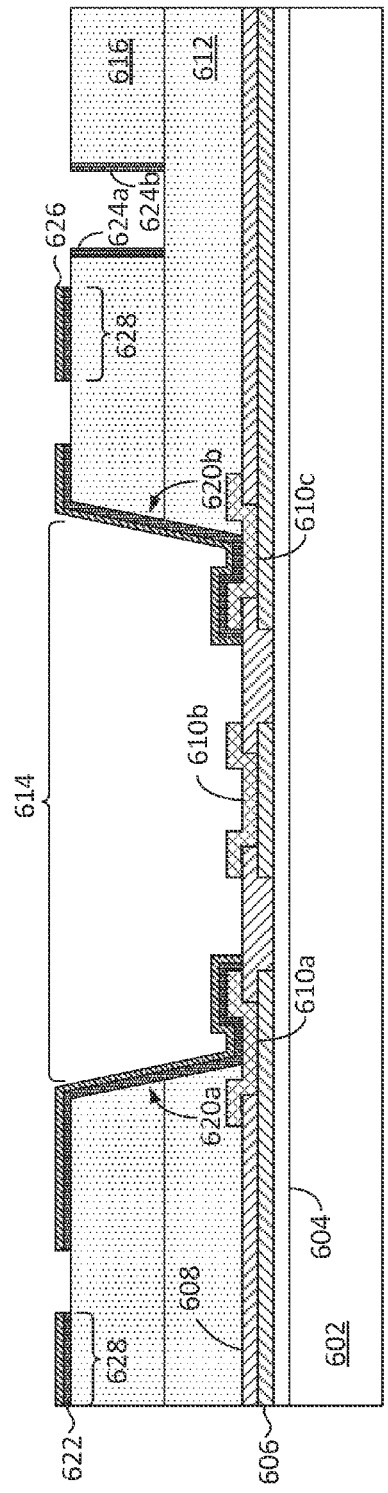
Figure 6H:
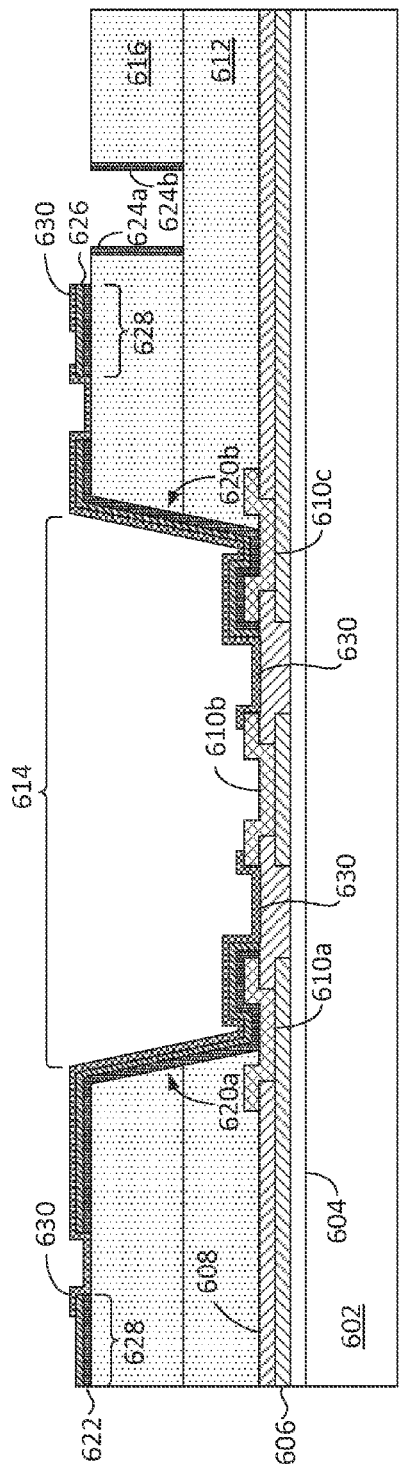
Figure 6I:
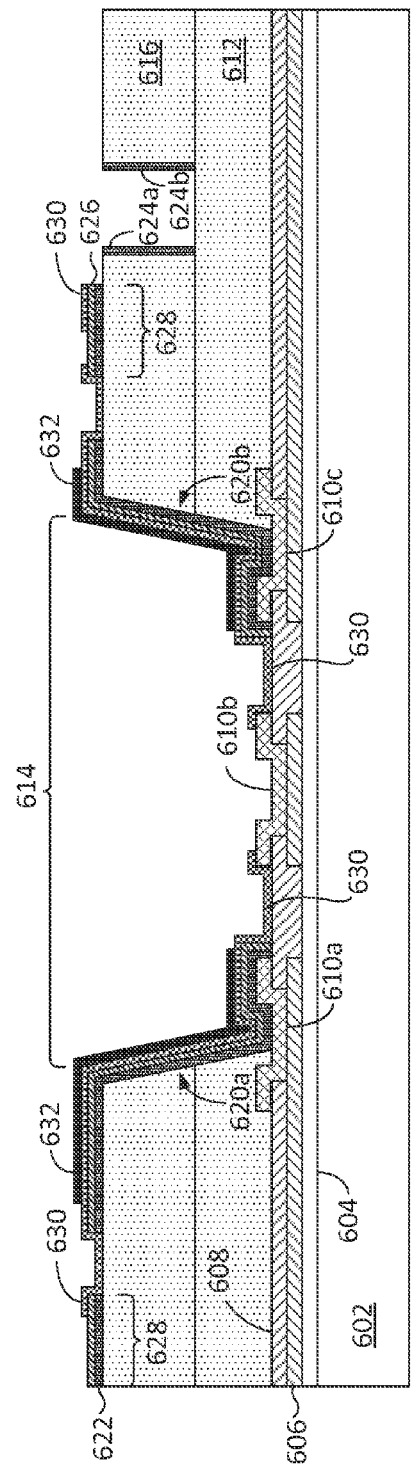
Figure 6J:
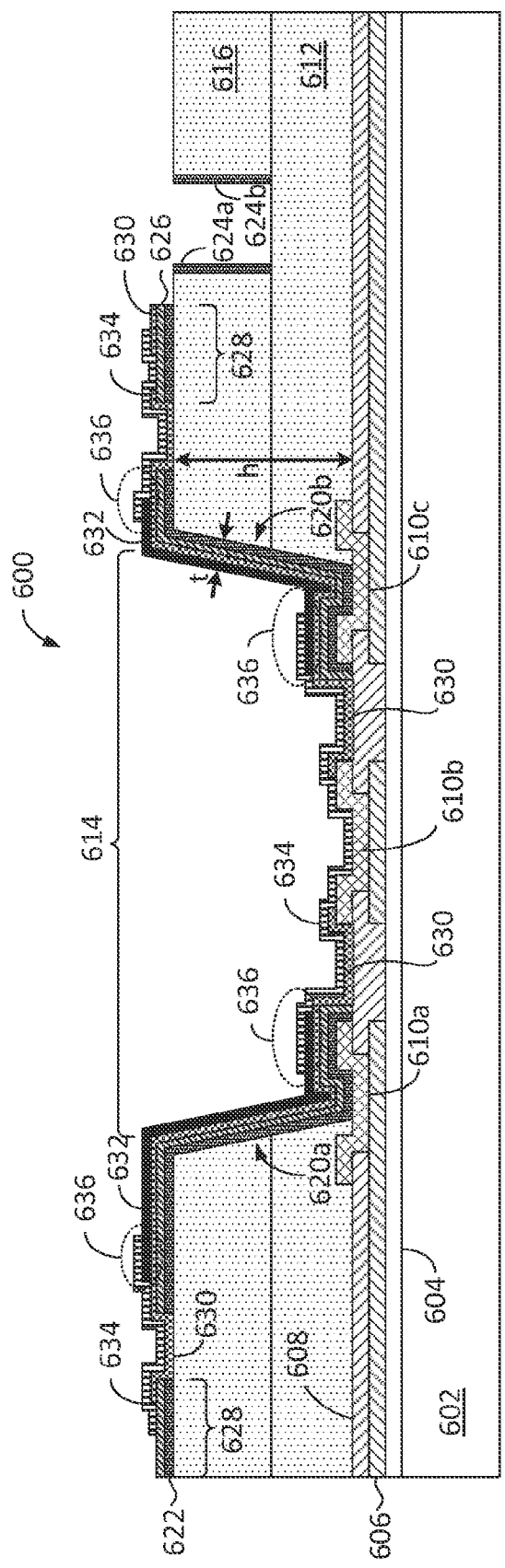

The process includes deposition and patterning of an aperture layer 604 (the results of which are shown in FIG. 6A). The deposition and patterning of the aperture layer 604 is followed by the deposition and patterning of a metal layer 606 (the results of which are shown in FIG. 6B). After depositing and patterning the metal layer 606, the process includes the deposition and patterning of terminal contacts (the results of which are shown in FIG. 6C). The process also includes the formation of a mold over which the anchor 600 and the TFT can be built. The formation of the mold includes the deposition and patterning of a first sacrificial layer 612 and the deposition and patterning of a second sacrificial layer 616 (the results of which are shown in FIGS. 6D and 6E, respectively). The process further includes the deposition and patterning of a first anchor material 622 (the results of which are shown in FIG. 6F). The process further includes the formation of a gate and conductive channel of the TFT. This includes the deposition and patterning of a gate metal 626, followed by the deposition and formation of the gate dielectric 630 and the deposition and patterning of the active semiconductor 632 (the results of which are shown in FIGS. 6G, 6H, and 6I, respectively). The process further includes the formation of the source/drain terminals by depositing and patterning a source/drain metal layer 634 (the results of which are shown in FIG. 6J).

As indicated above, the process begins with the deposition and patterning of an aperture layer 604 (the results of which are shown in FIG. 6A). In some implementations, the substrate 602 can be formed from transparent materials such as glass or plastic. An aperture layer 604 can be deposited over the substrate 602. The aperture layer 604 has been etched to form apertures (not shown) corresponding to a set of light modulators (not shown) as shown in FIG. 2. The aperture layer 604 can include a light reflecting layer for reflecting light that is not passed through the apertures back towards the backlight. This reflective feature of the light reflecting layer can be used for light recycling, which improves light output of the backlight. In some implementations, the reflective aperture layer 604 can be formed from a reflective material, such as a reflective metal or a stack of thin films forming a dielectric mirror. In some implementations, a light absorbing layer may be deposited over the aperture layer for improving the contrast ratio of the display.

The manufacturing process continues with the deposition and patterning of a metal layer 606. FIG. 6B shows the results of this processing stage. The metal layer 606 can be photomasked and etched to form interconnects that can provide signals to and from TFTs and other pixel circuitry. As shown in FIG. 6B, the metal layer is patterned to so that electrical connections can be made to terminal contacts of the TFT, which are to be subsequently deposited and patterned. In some implementations, materials such as, but not limited to, aluminum (Al), titanium (Ti), copper (Cu), nickel (Ni), etc. can be utilized to form the metal layer 606. A first passivation layer 608 is deposited over the metal layer 606 to insulate and protect the metal layer 606. The first passivation layer 608 can be patterned and etched to expose portions of the underlying metal layer 606. For example, the first passivation layer 608 is etched at regions 608a, 608b, and 608c, where terminal contacts of the TFT can be formed such that they make electrical contact with the metal layer 606. Materials such as, but not limited to aluminum oxide ($Al_2O_3$), chromium (III) oxide ($Cr_2O_3$), titanium oxide ($TiO_2$), hafnium oxide ($HfO_2$), vanadium oxide ($V_2O_5$), niobium oxide ($Nb_2O_5$), tantalum pentoxide ($Ta_2O_5$), $SiO_2$, or silicon nitride ($Si_3N_x$), etc. can be utilized for forming the first passivation layer 608.

FIG. 6C shows the result of deposition and patterning of TFT terminal contacts. In particular, a first gate contact 610a, a source/drain contact 610b, and a second gate contact 610c are formed at regions 608a, 608b, and 608c, respectively. As will be described below, the first and second gate contacts 610a and 610c electrically connect the gate terminal of the TFT to a first portion of the underlying metal layer 606, while the source/drain contact 610b electrically connects one of the source/drain terminals of the TFT to a different portion of the metal layer 606. The terminal contacts 610a, 610b, and 610c can be formed by deposition and patterning of conductive materials such as Al, Cu, Ti, Ni, etc. In some implementations, ITO or other conductive oxides can also be utilized.

FIG. 6D shows the result of deposition and patterning of the first sacrificial layer 612. The first sacrificial layer provides a foundation over which the anchor 600 and the TFT can be fabricated. As such, an anchor region 614 is provided for the formation of the anchor 600 and the TFT. The first sacrificial layer 612 can be formed using materials such as, but not limited to, polyamide, fluoropolymer, benzocyclobutene, polyphenylquin-oxylene, parylene, or polynorbornene. In some implementations, the first sacrificial layer can be patterned using standard photolithography techniques.

The patterning of the first sacrificial layer 612 can be followed by the deposition and patterning of the second sacrificial layer 616, the result of which is shown in FIG. 6E. The second sacrificial layer 616 is patterned to expose the terminal contacts 610a, 610b, and 610c in the anchor region 614. The patterning of the second sacrificial layer 616 in the anchor region 614 results in the formation of a first mold sidewall 620a and a second mold sidewall 620b. As will be discussed further below, the first and second mold sidewalls 620a and 620b can be utilized to form a TFT into the sidewalls of an anchor. The second sacrificial layer 616 is patterned to also form a beam region 618 to expose additional mold sidewalls for the formation of compliant beams. In some implementations, materials and techniques for the deposition and patterning of the second sacrificial layer 616 can be similar to the ones employed for the deposition and patterning of the first sacrificial layer 612.

FIG. 6F shows the result of deposition and patterning of the first anchor material 622. The first anchor material 622 is patterned such that the first anchor material 622 is deposited on the first and second mold sidewall 620a and 620b, and on the additional sidewalls near the beam region 618. The first anchor material 622 deposited on the first and second mold sidewalls 620a and 620b can provide mechanical strength to the anchor. The first anchor material 622 is also patterned such that the contacts 610a, 610b, and 610c remain exposed.

Furthermore, the first anchor material 622 forms the first and second compliant beams 624a and 624b on the sidewalls of the beam region 618. The first and second compliant beams 624a and 624b can be utilized in an actuator for actuating a light modulator supported by the anchor 600. Materials such as, but not limited to, amorphous silicon (a-Si), hydrogenated a-Si (a-Si:H), etc. can be used as the first anchor material 622. Deposition techniques such as, but not limited to, chemical vapor deposition (CVD), plasma-enhanced chemical vapor deposition (PECVD), etc., may be used for the deposition of the first anchor material 622. Patterning of the first anchor material 622 can be carried out, for example, using photomask and anisotropic etching.

FIG. 6G shows the result of deposition and patterning of the gate metal 626. After deposition, the gate metal 626 is patterned such the gate metal 626 remains over the first anchor material 622 near the first and second mold sidewalls 620a and 620b. The gate metal 626 makes contact with first and second gate contacts 610a and 610c. The gate metal 626 can also be patterned such that it remains over the top surface of the second sacrificial layer 616 at regions 628a and 628b for the formation of a second source/drain contact. Materials such as Al, Cu, Ti, Ni, etc., may be used as the gate metal 626. Deposition techniques such as, but not limited to, chemical vapor deposition (CVD), plasma-enhanced chemical vapor deposition (PECVD), etc., may be used for the deposition of the gate metal 626. Patterning of the gate metal 626 can be carried out, for example, using a photomask and an anisotropic etching.

The formation of the gate metal 626 can be followed by the deposition and patterning of the gate dielectric 630, the result of which is shown in FIG. 6H. The gate metal 626 and the gate dielectric 630 together form the gate of the TFT. The gate dielectric 630 can be utilized to insulate the gate metal 626 from various other layers of the TFT. As such, the gate dielectric 630 can be patterned to cover the gate metal 626. The gate dielectric 630, however, may leave some regions, such as regions 618, of the gate metal 626 uncovered to allow the gate metal 626 to make contact with source/drain terminal contacts. In some implementations, aluminum oxide ($Al_2O_3$), silicon oxide ($SiO_2$), tantalum pentoxide ($Ta_2O_5$), or silicon nitride ($Si_3N_4$) can be used as the gate dielectric 630. In some implementations, the gate dielectric 630 can be deposited using atomic layer deposition, sputtering and evaporation, etc.

FIG. 6I shows result of deposition and patterning of the active semiconductor 632. The active semiconductor 632 is deposited and then patterned such that it remains over the gate dielectric 630 on the sidewalls 620a and 620b. A portion of the active semiconductor 632 is also patterned to remain over the top surface of the second sacrificial material 616 to allow electrical contact with source/drain terminal contacts of the TFT. The active semiconductor 632 provides a controllable conductive channel between the source/drain terminals of the TFT. Specifically, the active semiconductor 632 becomes conductive when the gate metal 626 is energized with a voltage that is greater than a threshold voltage of the TFT. In some implementations, materials such as a-Si, indium gallium zinc oxide (IGZO), microcrystalline silicon, etc., can be utilized for forming the active semiconductor 632. In some implementations, the active semiconductor 632 can be deposited using atomic layer deposition, sputtering and evaporation, etc., and patterned using standard photolithography processes.

After the formation of the active semiconductor 632, the source/drain metal 634 is deposited and patterned, the result of which is shown in FIG. 6J. The source/drain metal 634 forms the source/drain terminals of the TFT. The source/drain metal 634 makes contact with the active semiconductor 632 at regions 636 to form the source/drain terminals. Thus, one source/drain terminal and the gate terminal are of the TFT is situated at the base or floor of the anchor 600 while the other one of the source/drain terminal is situated at the top of the anchor 600. In some implementations, the ratio of the height (h) of the TFT to its thickness (t) can be at least about 1.4:1. In some other implementations, the ratio of the height to its thickness can be as much as or greater than about 4:1.

In some implementations, a passivation layer can be deposited over all exposed materials shown in FIG. 6J. Such passivation material can protect the anchor 600 and the TFT from interaction with materials that may be used for additional fabrication processes that may follow as well as against fluids in which the anchor 600 may be immersed during operation.

Figure 7A:
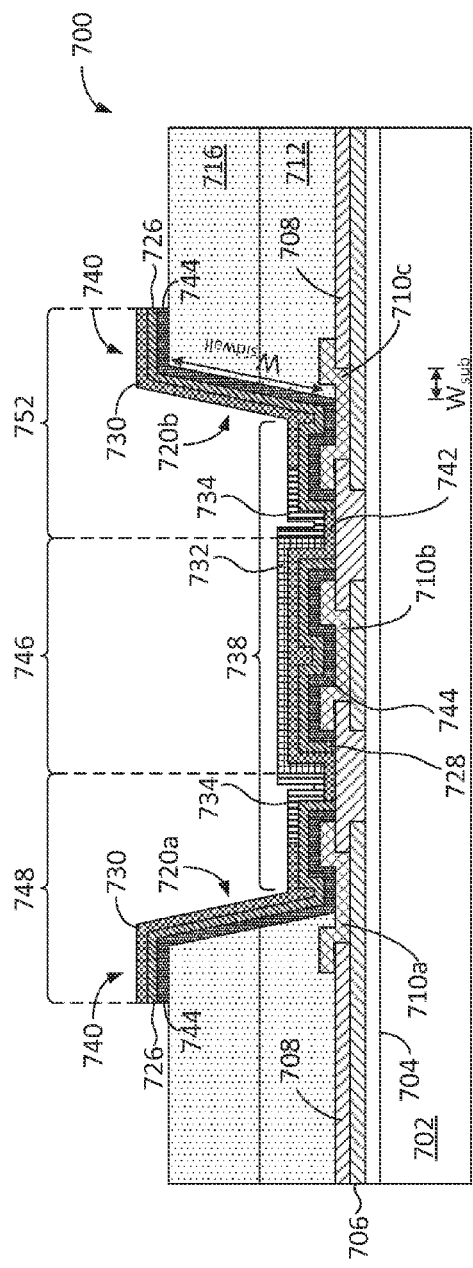
FIGS. 7A and 7B show example cross sectional and top views, respectively, of the result of an intermediate manufacturing stage of an example process to form a TFT/spacer.
Figure 7B:
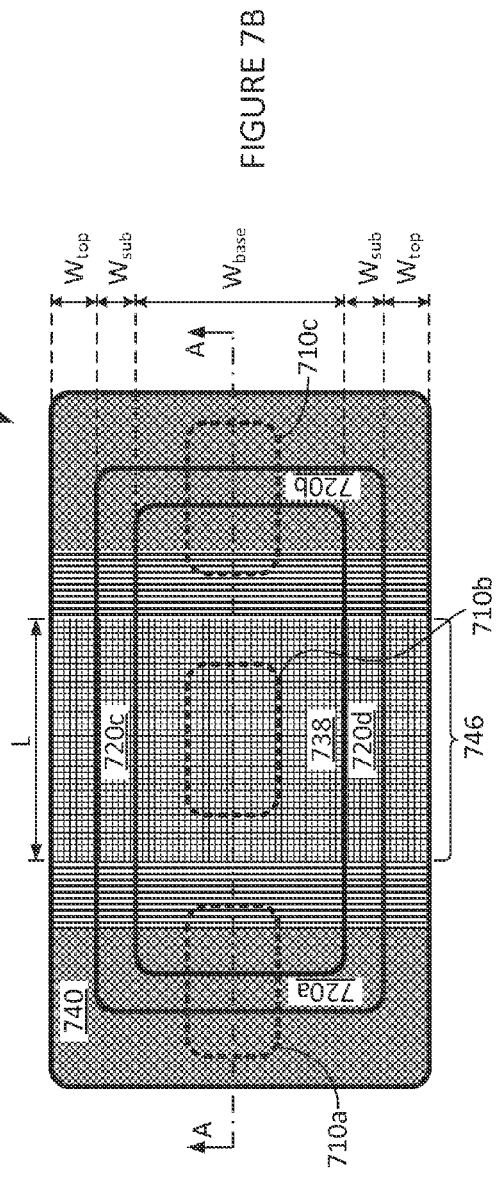

FIGS. 7A and 7B show example cross sectional and top views, respectively, of the result of an intermediate manufacturing stage of an example process to form a TFT/spacer 700. The TFT/spacer 700 is a spacer that incorporates a TFT into its structure. In particular, FIGS. 7A and 7B show the stage of manufacturing after the formation of the TFT/spacer 700 prior to the deposition of a passivation layer. The cross-sectional view shown in FIG. 7A is taken along a plane (denoted by axis AA) that is normal to the TFT/spacer 700 shown in FIG. 7B. For the sake of clarity the sacrificial mold 716, shown in the cross-sectional view of FIG. 7A, is not shown in the top view of FIG. 7B.

The TFT/spacer 700 shown in FIGS. 7A and 7B differs from the anchor 600 and the TFT shown in FIG. 6J in that while at least one source/drain terminal of the TFT shown in FIG. 6J is situated at the top of the anchor 600, all the terminals (source, drain and gate) of the TFT/spacer 700 shown in FIGS. 7A and 7B are situated at the base or floor of the TFT/spacer 700. FIGS. 7A and 7B also show utilizing the sidewalls to increase the effective width of the TFT/spacer 700. In some implementations, the TFT/spacer 700 can be utilized in forming the spacer 220 shown in FIG. 2.

The TFT/spacer 700 built on a substrate 702. The substrate 702 can be similar to the substrate 602 discussed above in FIG. 6A. An aperture layer 704 is deposited and patterned over the substrate 702. The aperture layer 704 can be similar to the aperture layer 604 discussed above in FIG. 6A, and can be patterned to form apertures for allowing light generated by a backlight to pass through towards a light modulator. The aperture layer can also include a rear reflective coating for providing light recycling and a front light absorbing coating for improving the contrast ratio.

The TFT/spacer 700 formed, in part, over the mold sidewalls of a first sacrificial layer 712 and a second sacrificial layer 716. The first and second sacrificial layers 712 and 716 can be similar to the first and second sacrificial layers 612 and 616 discussed above in relation to FIGS. 6D and 6E.

A metal layer 706 and a first passivation layer 708 are patterned to form regions for the formation of terminal contacts 710a, 710b, and 710c. In some implementations, such as the one shown in FIGS. 7A and 7B, the terminal contacts 710a and 710c can electrically connect the source/drain terminals 748 and 752 of the TFT/spacer 700 to one portion of the underlying metal layer 706, while the terminal contact 710b can electrically connect a gate terminal 746 of the TFT/spacer 700 to another portion of the metal layer 706. The metal layer 706 can be patterned to form various interconnects for carrying electrical signals to and from the terminals of the TFT/spacer 700.

Referring to FIG. 7A, the TFT/spacer 700 includes the gate terminal 746, and two source/drain terminals 748 and 752.

The gate terminal 746 includes a stack of a support material 744, a gate metal 728 and a dielectric 742 fabricated below an active semiconductor 732. The TFT/spacer 700 shown in FIGS. 7A and 7B is a bottom-gate TFT. However, a person having ordinary skill in the art will readily understand that the TFT/spacer 700 can also be fabricated in a top-gate configuration. The support material 744 can be a conducting material such as, but not limited to, a-Si, a-si:H, etc., and provide structural strength to the TFT/spacer 700. The gate metal 728 can also be a conductor, such as, but not limited to, Al, Cu, Ti, Ni, etc. The dielectric 742 insulates the gate metal 728 from the active semiconductor 732.

Each of the two source/drain terminals 748 and 752 include a stack of the support material 744 and a source/drain metal 726. The source drain metal 726 can include conductors such as, but not limited to, Al, Cu, Ti, Ni, etc. The source drain terminals 748 and 752 also include an additional metal layer 734 for electrically connecting the source/drain metal 726 to the active semiconductor 732. The source/drain terminals 748 and 752 may be coated with a dielectric material 730 for providing insulation to the source/drain metal 726.

As shown in the cross-section and the top-view of the TFT/spacer 700 in FIGS. 7A and 7B, the TFT/spacer 700 forms a bowl shape having a base (or floor) 738 and a top portion 740. Four sidewalls, a first sidewall 720a, a second sidewall 720b, a third sidewall 720c and a fourth sidewall 720d extend from the base 738 to the top portion 740. The cross-sections of the first and the second sidewalls 720a and 720b can be seen in FIG. 7A. The first and second sidewalls 720a and 720b can have a relatively steep angle with respect to the substrate 702. In some implementations, the first and second sidewalls 720a and 720b can be substantially normal with respect to the substrate 702. The width of the first and second sidewalls 720a and 720b from the base 738 to the top portion 740 can indicated by $W_{sidwall}$, as shown in FIG. 7A. Furthermore, the first and second sidewalls 720a and 720b can occupy a width of $W_{sub}$ over the plane of the substrate 702. Generally, $W_{sidwall}$ is greater than $W_{sub}$. The third and fourth sidewalls 720c and 720d can also have dimensions similar to that of the first and second sidewalls 720a and 720b.

The effective width of the TFT/spacer 700 can be increased by manufacturing the gate and source drain terminals into the sidewalls of the TFT/spacer 700 resulting in only a small impact on the area occupied by the TFT/spacer 700 over the substrate 702. Referring to FIG. 7B, the gate terminal 746 of the TFT/spacer 700 extends from the base 738 to the top portion 740 of the TFT/spacer 700 along the third and fourth sidewalls 720c and 720d. The effective width of the TFT/spacer 700 is a function of the width of the gate terminal 746. The width of the gate terminal 746 can be a sum of the widths of the gate terminal 746 over the base 738, the third sidewall 720c, the fourth sidewall 720d and the top portion 740. As shown in FIG. 7B, the width of the gate terminal 746 over the base 738 is equal to $W_{base}$. Furthermore the widths of the gate terminal 746 over the top portion 740 adjacent to the third and fourth sidewalls 720c and 720d is each equal to $W_{top}$. As mentioned above, the width of the third and fourth sidewalls 720c and 720d is indicated by $W_{sidewall}$. Therefore, the width of the gate terminal 746 over each of the third and fourth sidewalls can also be equal to $W_{sidewall}$. Thus, the total width of the gate terminal 746 can be equal to $W_{base}+2(W_{top}+W_{sidwall})$. However, the width of the area occupied by the gate terminal 746 over the substrate is equal to $W_{base}+2(W_{top}+W_{sub})$. As $W_{sidwall}$ is greater than $W_{sub}$, the total width of the gate terminal 746 is greater than the width of the area occupied by the gate terminal 746 over the substrate 702. In some implementations, the ratio of the height of the TFT/spacer 700 to its thickness can be about 1.4:1. In some implementations, the ratio can be as much as or greater than about 4:1.

In some implementations, building components on or as part of three-dimensional structures can be used to reduce a bezel size of a display device. For example, building components on or as part of three-dimensional structures can be utilized for reducing the bezel size of host device 120 shown in FIG. 1B. As discussed above, the host device 120 can include a data apparatus 128, which, in turn, can include various drivers such as scan drivers 130, data drivers 132, common drivers 138, and lamp drivers 148. In some implementations, one or more of these drivers may be positioned along an edge of a substrate over which the display apparatus 128 is built. For example, in some implementations, some circuitry of the scan drivers 130 may be located at one or both ends of each row of the array 150 of display elements. In some other implementations, circuitry from other drivers, such as the data drivers 132, common drivers, 138, or the lamp drivers 148, of the display apparatus 128 may also occupy area along the perimeter of the host device 120.

The area occupied by these circuits (or for that matter any circuitry of the host device 120) along the ends of the rows or along the edges of the host device 120 can result in an increase in the size of the bezel along the perimeter of the host device 120. An increase in the size of the bezel may, in turn, decrease the active display area of the host device 120. In some implementations, to reduce the bezel size, the circuitry along the edges of the host device 120 can be built on the glass substrate.

To further reduce the bezel size, in some implementations, one or more components of the circuitry located along the edges of the host device 120 can be built on or as part of three-dimensional structures on the glass substrate. For example, the components can be built on or as part of sidewalls of three-dimensional structures that are formed along the edges of the substrate. As discussed above, in relation to FIGS. 4A-7B, building components on or as part of three-dimensional structures reduces the area occupied by the components over the substrate. Thus, the area occupied by the circuitry along the edge of the host device 120 can be reduced. This, in turn, reduces the size of the bezel around the active display area of the host device 120.

In some implementations, one or more components of the circuitry along the edges of the host device 120 can include TFTs, capacitors, interconnects, etc. These components can be built using techniques similar to the ones described above in relation to FIGS. 4A-7B.

Figure 8:
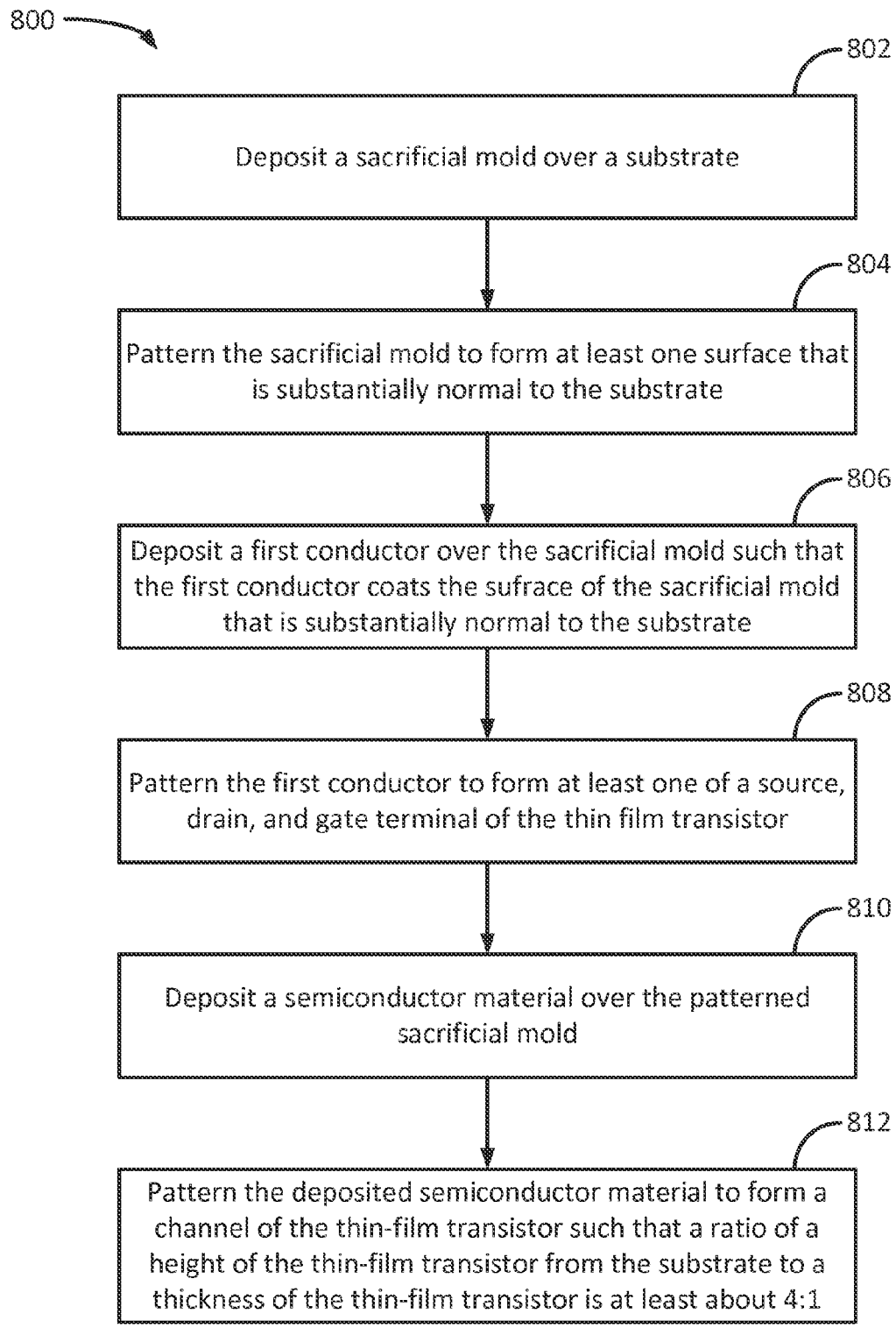
FIG. 8 shows an example flow diagram of a process for fabricating an example MEMS structure having three-dimensional TFTs.

FIG. 8 shows an example flow diagram of a process 800 for fabricating an example MEMS structure having three-dimensional transistors. In particular, the process 800 includes depositing a sacrificial mold over a substrate (stage 802), patterning the sacrificial mold to form at least one surface that is substantially normal to the substrate (stage 804), depositing a first conductor over the sacrificial mold such that the first conductor coats the surface of the sacrificial mold that is substantially normal to the substrate (stage 806), patterning the first conductor to form at least one of a source, drain, and gate terminal of the thin film transistor (stage 808), depositing a semiconductor material over the patterned sacrificial mold (stage 810), and patterning the deposited semiconductor material to form a channel of the thin-film transistor (stage 812).

The process 800 includes depositing a sacrificial mold over a substrate (stage 802). One example of this process stage was discussed above in relation to FIGS. 6D and 6E, in which the first sacrificial layer 612 and the second sacrificial layer 616 are deposited over the substrate 602.

The process 800 further includes patterning the sacrificial mold to form at least one surface that is substantially normal to the substrate (stage 804). One example of this process stage was discussed above in relation to FIGS. 6D and 6E, in which the first sacrificial layer 612 and the second sacrificial layer 616 are patterned to form an anchor region 614. The anchor region 614 includes sidewalls 620a and 620b, which are substantially normal to the substrate 602.

The process 800 further includes depositing a first conductor over the sacrificial mold such that the first conductor coats the surface of the sacrificial mold that is substantially normal to the substrate (stage 806). One example of this process stage was discussed above in relation to FIG. 6G, in which a gate metal 626, which is a conductor, is deposited over the sidewalls 620a and 620b of the first and second sacrificial layers 612 and 616.

The process 800 also includes patterning the first conductor to form at least one of a source, drain, and gate terminal of the thin film transistor (stage 808). One example of this process stage was discussed above in relation to FIG. 6G, in which the gate metal 626 is patterned to form a gate terminal of the TFT formed into the first and second sidewalls 620a and 620b of the first and second sacrificial layers 612 and 616.

The process 800 additionally includes depositing a semiconductor material over the patterned sacrificial mold (stage 810), and patterning the deposited semiconductor material to form a channel of the thin-film transistor such that a ratio of a height of the thin-film transistor from the substrate to a thickness of the thin-film transistor is at least about 4:1 (stage 812). One example of these process stages was discussed above in relation to FIG. 6I, in which the active semiconductor 632 is deposited and patterned into the first and second sidewalls 620a and 620b to form a channel of the TFT. Also, as discussed above with respect to FIG. 6J, the ratio of the height (h) of the TFT to its thickness (t) can be as much as or greater than about 4:1.

Figure 9A:
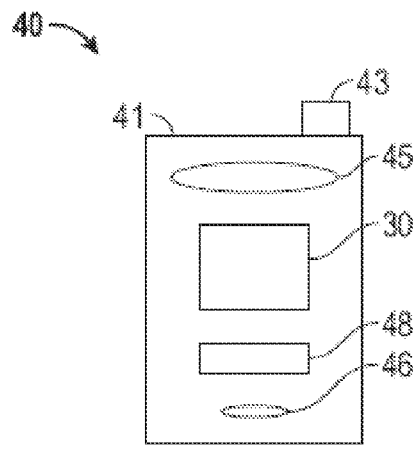
FIGS. 9A and 9B show system block diagrams of an example display device that includes a plurality of display elements.
Figure 9B:
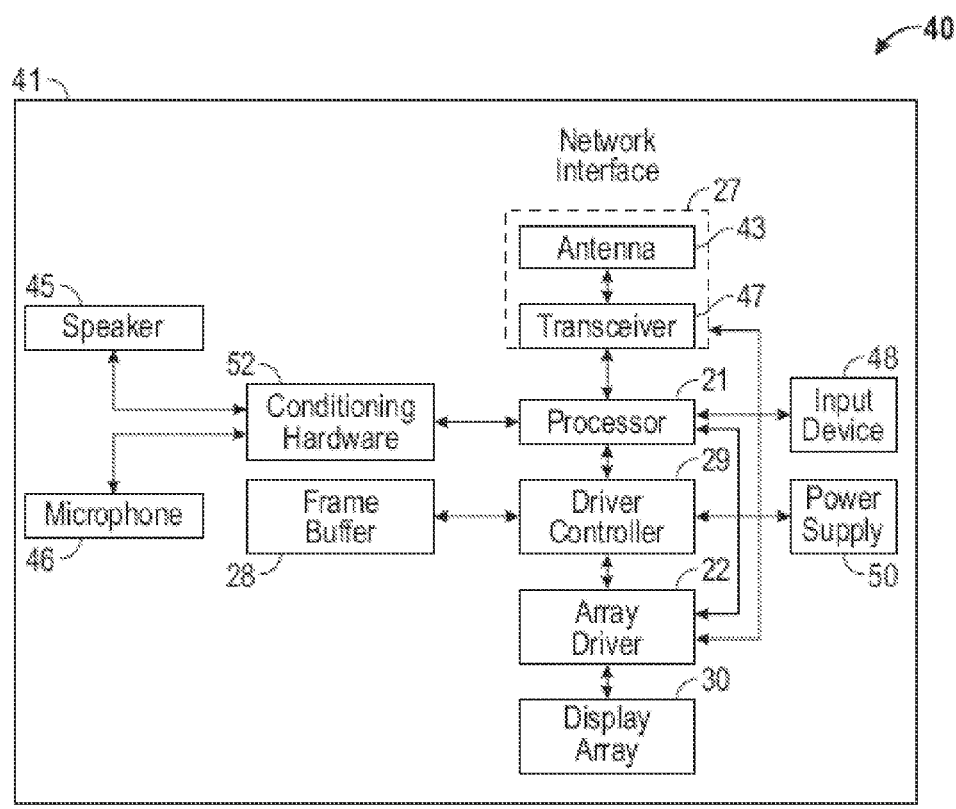

FIGS. 9A and 9B show system block diagrams of an example display device 40 that includes a plurality of display elements. The display device 40 can be, for example, a smart phone, a cellular or mobile telephone. However, the same components of the display device 40 or slight variations thereof are also illustrative of various types of display devices such as televisions, computers, tablets, e-readers, hand-held devices and portable media devices.

The display device 40 includes a housing 41, a display 30, an antenna 43, a speaker 45, an input device 48 and a microphone 46. The housing 41 can be formed from any of a variety of manufacturing processes, including injection molding, and vacuum forming. In addition, the housing 41 may be made from any of a variety of materials, including, but not limited to: plastic, metal, glass, rubber and ceramic, or a combination thereof. The housing 41 can include removable portions (not shown) that may be interchanged with other removable portions of different color, or containing different logos, pictures, or symbols.

The display 30 may be any of a variety of displays, including a bi-stable or analog display, as described herein. The display 30 also can be configured to include a flat-panel display, such as plasma, electroluminescent (EL) displays, OLED, super twisted nematic (STN) display, LCD, or thin-film transistor (TFT) LCD, or a non-flat-panel display, such as a cathode ray tube (CRT) or other tube device. In addition, the display 30 can include a mechanical light modulator-based display, as described herein.

The components of the display device 40 are schematically illustrated in FIG. 9B. The display device 40 includes a housing 41 and can include additional components at least partially enclosed therein. For example, the display device 40 includes a network interface 27 that includes an antenna 43 which can be coupled to a transceiver 47. The network interface 27 may be a source for image data that could be displayed on the display device 40. Accordingly, the network interface 27 is one example of an image source module, but the processor 21 and the input device 48 also may serve as an image source module. The transceiver 47 is connected to a processor 21, which is connected to conditioning hardware 52. The conditioning hardware 52 may be configured to condition a signal (such as filter or otherwise manipulate a signal). The conditioning hardware 52 can be connected to a speaker 45 and a microphone 46. The processor 21 also can be connected to an input device 48 and a driver controller 29. The driver controller 29 can be coupled to a frame buffer 28, and to an array driver 22, which in turn can be coupled to a display array 30. One or more elements in the display device 40, including elements not specifically depicted in FIG. 9A, can be configured to function as a memory device and be configured to communicate with the processor 21. In some implementations, a power supply 50 can provide power to substantially all components in the particular display device 40 design.

The network interface 27 includes the antenna 43 and the transceiver 47 so that the display device 40 can communicate with one or more devices over a network. The network interface 27 also may have some processing capabilities to relieve, for example, data processing requirements of the processor 21. The antenna 43 can transmit and receive signals. In some implementations, the antenna 43 transmits and receives RF signals according to the IEEE 16.11 standard, including IEEE 16.11(a), (b), or (g), or the IEEE 802.11 standard, including IEEE 802.11a, b, g, n, and further implementations thereof. In some other implementations, the antenna 43 transmits and receives RF signals according to the Bluetooth® standard. In the case of a cellular telephone, the antenna 43 can be designed to receive code division multiple access (CDMA), frequency division multiple access (FDMA), time division multiple access (TDMA), Global System for Mobile communications (GSM), GSM/General Packet Radio Service (GPRS), Enhanced Data GSM Environment (EDGE), Terrestrial Trunked Radio (TETRA), Wideband-CDMA (W-CDMA), Evolution Data Optimized (EV-DO), 1xEV-DO, EV-DO Rev A, EV-DO Rev B, High Speed Packet Access (HSPA), High Speed Downlink Packet Access (HSDPA), High Speed Uplink Packet Access (HSUPA), Evolved High Speed Packet Access (HSPA+), Long Term Evolution (LTE), AMPS, or other known signals that are used to communicate within a wireless network, such as a system utilizing 3G, 4G or 5G technology. The transceiver 47 can preprocess the signals received from the antenna 43 so that they may be received by and further manipulated by the processor 21. The transceiver 47 also can process signals received from the processor 21 so that they may be transmitted from the display device 40 via the antenna 43.

In some implementations, the transceiver 47 can be replaced by a receiver. In addition, in some implementations, the network interface 27 can be replaced by an image source, which can store or generate image data to be sent to the processor 21. The processor 21 can control the overall operation of the display device 40. The processor 21 receives data, such as compressed image data from the network interface 27 or an image source, and processes the data into raw image data or into a format that can be readily processed into raw image data. The processor 21 can send the processed data to the driver controller 29 or to the frame buffer 28 for storage. Raw data typically refers to the information that identifies the image characteristics at each location within an image. For example, such image characteristics can include color, saturation and gray-scale level.

The processor 21 can include a microcontroller, CPU, or logic unit to control operation of the display device 40. The conditioning hardware 52 may include amplifiers and filters for transmitting signals to the speaker 45, and for receiving signals from the microphone 46. The conditioning hardware 52 may be discrete components within the display device 40, or may be incorporated within the processor 21 or other components.

The driver controller 29 can take the raw image data generated by the processor 21 either directly from the processor 21 or from the frame buffer 28 and can re-format the raw image data appropriately for high speed transmission to the array driver 22. In some implementations, the driver controller 29 can re-format the raw image data into a data flow having a raster-like format, such that it has a time order suitable for scanning across the display array 30. Then the driver controller 29 sends the formatted information to the array driver 22. Although a driver controller 29, such as an LCD controller, is often associated with the system processor 21 as a stand-alone Integrated Circuit (IC), such controllers may be implemented in many ways. For example, controllers may be embedded in the processor 21 as hardware, embedded in the processor 21 as software, or fully integrated in hardware with the array driver 22.

The array driver 22 can receive the formatted information from the driver controller 29 and can re-format the video data into a parallel set of waveforms that are applied many times per second to the hundreds, and sometimes thousands (or more), of leads coming from the display's x-y matrix of display elements. In some implementations, the array driver 22 and the display array 30 are a part of a display module. In some implementations, the driver controller 29, the array driver 22, and the display array 30 are a part of the display module.

In some implementations, the driver controller 29, the array driver 22, and the display array 30 are appropriate for any of the types of displays described herein. For example, the driver controller 29 can be a conventional display controller or a bi-stable display controller (such as a mechanical light modulator display element controller). Additionally, the array driver 22 can be a conventional driver or a bi-stable display driver (such as a mechanical light modulator display element controller). Moreover, the display array 30 can be a conventional display array or a bi-stable display array (such as a display including an array of mechanical light modulator display elements). In some implementations, the driver controller 29 can be integrated with the array driver 22. Such an implementation can be useful in highly integrated systems, for example, mobile phones, portable-electronic devices, watches or small-area displays.

In some implementations, the input device 48 can be configured to allow, for example, a user to control the operation of the display device 40. The input device 48 can include a keypad, such as a QWERTY keyboard or a telephone keypad, a button, a switch, a rocker, a touch-sensitive screen, a touch-sensitive screen integrated with the display array 30, or a pressure- or heat-sensitive membrane. The microphone 46 can be configured as an input device for the display device 40. In some implementations, voice commands through the microphone 46 can be used for controlling operations of the display device 40.

The power supply 50 can include a variety of energy storage devices. For example, the power supply 50 can be a rechargeable battery, such as a nickel-cadmium battery or a lithium-ion battery. In implementations using a rechargeable battery, the rechargeable battery may be chargeable using power coming from, for example, a wall socket or a photovoltaic device or array. Alternatively, the rechargeable battery can be wirelessly chargeable. The power supply 50 also can be a renewable energy source, a capacitor, or a solar cell, including a plastic solar cell or solar-cell paint. The power supply 50 also can be configured to receive power from a wall outlet.

In some implementations, control programmability resides in the driver controller 29 which can be located in several places in the electronic display system. In some other implementations, control programmability resides in the array driver 22. The above-described optimization may be implemented in any number of hardware and/or software components and in various configurations.

As used herein, a phrase referring to "at least one of" a list of items refers to any combination of those items, including single members. As an example, "at least one of: a, b, or c" is intended to cover: a, b, c, a-b, a-c, b-c, and a-b-c.

The various illustrative logics, logical blocks, modules, circuits and algorithm processes described in connection with the implementations disclosed herein may be implemented as electronic hardware, computer software, or combinations of both. The interchangeability of hardware and software has been described generally, in terms of functionality, and illustrated in the various illustrative components, blocks, modules, circuits and processes described above. Whether such functionality is implemented in hardware or software depends upon the particular application and design constraints imposed on the overall system.

The hardware and data processing apparatus used to implement the various illustrative logics, logical blocks, modules and circuits described in connection with the aspects disclosed herein may be implemented or performed with a general purpose single- or multi-chip processor, a digital signal processor (DSP), an application specific integrated circuit (ASIC), a field programmable gate array (FPGA) or other programmable logic device, discrete gate or transistor logic, discrete hardware components, or any combination thereof designed to perform the functions described herein. A general purpose processor may be a microprocessor, or, any conventional processor, controller, microcontroller, or state machine. A processor also may be implemented as a combination of computing devices, e.g., a combination of a DSP and a microprocessor, a plurality of microprocessors, one or more microprocessors in conjunction with a DSP core, or any other such configuration. In some implementations, particular processes and methods may be performed by circuitry that is specific to a given function.

In one or more aspects, the functions described may be implemented in hardware, digital electronic circuitry, computer software, firmware, including the structures disclosed in this specification and their structural equivalents thereof, or in any combination thereof. Implementations of the subject matter described in this specification also can be implemented as one or more computer programs, i.e., one or more modules of computer program instructions, encoded on a computer storage media for execution by, or to control the operation of, data processing apparatus.

Various modifications to the implementations described in this disclosure may be readily apparent to those skilled in the art, and the generic principles defined herein may be applied to other implementations without departing from the spirit or scope of this disclosure. Thus, the claims are not intended to be limited to the implementations shown herein, but are to be accorded the widest scope consistent with this disclosure, the principles and the novel features disclosed herein.

Additionally, a person having ordinary skill in the art will readily appreciate, the terms "upper" and "lower" are sometimes used for ease of describing the figures, and indicate relative positions corresponding to the orientation of the figure on a properly oriented page, and may not reflect the proper orientation of any device as implemented.

Certain features that are described in this specification in the context of separate implementations also can be implemented in combination in a single implementation. Conversely, various features that are described in the context of a single implementation also can be implemented in multiple implementations separately or in any suitable subcombination. Moreover, although features may be described above as acting in certain combinations and even initially claimed as such, one or more features from a claimed combination can in some cases be excised from the combination, and the claimed combination may be directed to a subcombination or variation of a subcombination.

Similarly, while operations are depicted in the drawings in a particular order, this should not be understood as requiring that such operations be performed in the particular order shown or in sequential order, or that all illustrated operations be performed, to achieve desirable results. Further, the drawings may schematically depict one more example processes in the form of a flow diagram. However, other operations that are not depicted can be incorporated in the example processes that are schematically illustrated. For example, one or more additional operations can be performed before, after, simultaneously, or between any of the illustrated operations. In certain circumstances, multitasking and parallel processing may be advantageous. Moreover, the separation of various system components in the implementations described above should not be understood as requiring such separation in all implementations, and it should be understood that the described program components and systems can generally be integrated together in a single software product or packaged into multiple software products. Additionally, other implementations are within the scope of the following claims. In some cases, the actions recited in the claims can be performed in a different order and still achieve desirable results.

What is claimed is:

1. An apparatus comprising:
   a substrate;
   an electromechanical systems (EMS) structure having a first sidewall extending up from the substrate, wherein the first sidewall is formed from a plurality of layers of material; and
   a thin-film transistor having a component that forms a portion of at least a first layer of the first sidewall, wherein the thin-film transistor includes a gate terminal and a channel and wherein the gate terminal is between the substrate and the channel,
   wherein a ratio of a height of the first sidewall over a thickness of the first sidewall is at least about 4:1.

2. The apparatus of claim 1, wherein the first layer of the first sidewall forms the channel of the thin-film transistor, and the first layer includes an amorphous semiconductor.

3. The apparatus of claim 1, wherein at least a second layer of the first sidewall forms the gate terminal of the thin-film transistor.

4. The apparatus of claim 1, wherein the first layer of the first sidewall forms a source terminal or a drain terminal of the thin-film transistor.

5. The apparatus of claim 1, wherein the EMS structure includes a floor, and at least one layer of material of the floor of the EMS structure forms a gate terminal of the thin-film transistor.

6. The apparatus of claim 5, wherein the EMS structure includes an elevated surface that is elevated with respect to the floor, and at least one layer of material of the elevated surface forms a source or a drain terminal of the thin-film transistor.

7. The apparatus of claim 1, wherein the EMS structure includes a floor, and at least one layer of material of the floor of the EMS structure forms a source or drain terminal of the thin-film transistor.

8. The apparatus of claim 7, wherein the EMS structure includes an elevated surface that is elevated with respect to the floor, and at least one layer of material of the elevated surface forms a gate terminal of the thin-film transistor.

9. The apparatus of claim 1, further comprising a EMS light modulator suspended over the substrate, wherein:
   the EMS structure includes an anchor that supports a portion of an actuator configured to control the state of the EMS light modulator; and
   the transistor controls the application of an actuation voltage to the portion of the actuator.

10. The apparatus of claim 1, wherein the first sidewall is oriented at least substantially normal to the substrate.

11. The apparatus of claim 1, wherein the first sidewall is positioned along at least one outer edge of the apparatus.

12. The apparatus of claim 1, wherein the substrate is a glass substrate.

13. The apparatus of claim 1, further comprising:
    a display having the substrate, the EMS structure and the thin film transistor;
    a processor that is configured to communicate with the display, the processor being configured to process image data; and
    a memory device that is configured to communicate with the processor.

14. The apparatus of claim 13, further comprising:
    a driver circuit configured to send at least one signal to the display; and
    a controller configured to send at least a portion of the image data to the driver circuit.

15. The apparatus of claim 13, further comprising:
    an image source module configured to send the image data to the processor, wherein the image source module comprises at least one of a receiver, transceiver, and transmitter.

16. The apparatus of claim 13, further comprising:
    an input device configured to receive input data and to communicate the input data to the processor.

17. An apparatus comprising:
    a substrate;
    an electromechanical systems (EMS) structure having a first sidewall extending up from the substrate, wherein the first sidewall is formed from a plurality of layers of material and a ratio of a height of the first sidewall over a thickness of the first sidewall is at least about 4:1; and
    a thin-film transistor having a component that forms a portion of at least a first layer of the first sidewall and having a channel, wherein the channel has a channel width and a channel length, and the channel width is defined in part based on the height of the first sidewall.

18. The apparatus of claim 17, wherein the first layer of the first sidewall forms the channel of the thin-film transistor, and the first layer includes an amorphous semiconductor.

19. The apparatus of claim 17, wherein at least a second layer of the first sidewall forms a gate terminal of the thin-film transistor.

20. The apparatus of claim 17, wherein the first layer of the first sidewall forms a source terminal or a drain terminal of the thin-film transistor.

21. The apparatus of claim 17, wherein the EMS structure includes a floor, and at least one layer of material of the floor of the EMS structure forms a gate terminal of the thin-film transistor.

22. The apparatus of claim 21, wherein the EMS structure includes an elevated surface that is elevated with respect to the floor, and at least one layer of material of the elevated surface forms a source or a drain terminal of the thin-film transistor.

23. The apparatus of claim 17, wherein the EMS structure includes a floor, and at least one layer of material of the floor of the EMS structure forms a source or drain terminal of the thin-film transistor.

24. The apparatus of claim 23, wherein the EMS structure includes an elevated surface that is elevated with respect to the floor, and at least one layer of material of the elevated surface forms a gate terminal of the thin-film transistor.

25. The apparatus of claim 17, further comprising a EMS light modulator suspended over the substrate, wherein:
   the EMS structure includes an anchor that supports a portion of an actuator configured to control the state of the EMS light modulator; and
   the transistor controls the application of an actuation voltage to the portion of the actuator.

26. The apparatus of claim 17, wherein the first sidewall is oriented at least substantially normal to the substrate.

27. The apparatus of claim 17, wherein the first sidewall is positioned along at least one outer edge of the apparatus.

28. The apparatus of claim 17, wherein the substrate is a glass substrate.

* * * * *